(12) United States Patent
Sundaresan et al.

(10) Patent No.: US 12,051,720 B2
(45) Date of Patent: Jul. 30, 2024

(54) INVERSION CHANNEL DEVICES ON MULTIPLE CRYSTAL ORIENTATIONS

(71) Applicant: GeneSiC Semiconductor Inc., Dulles, VA (US)

(72) Inventors: Siddarth Sundaresan, Dulles, VA (US); Ranbir Singh, Dulles, VA (US); Jaehoon Park, Dulles, VA (US)

(73) Assignee: GENESIC SEMICONDUCTOR INC., Dulles, VA (US)

( * ) Notice: Subject to any disclaimer, the term of this patent is extended or adjusted under 35 U.S.C. 154(b) by 0 days.

(21) Appl. No.: 17/970,928

(22) Filed: Oct. 21, 2022

(65) Prior Publication Data

US 2023/0040858 A1    Feb. 9, 2023

Related U.S. Application Data

(62) Division of application No. 17/864,761, filed on Jul. 14, 2022, now Pat. No. 11,862,669, which is a (Continued)

(51) Int. Cl.
*H01L 29/04* (2006.01)
*H01L 29/16* (2006.01)
(Continued)

(52) U.S. Cl.
CPC ........ *H01L 29/045* (2013.01); *H01L 29/1608* (2013.01); *H01L 29/66068* (2013.01); *H01L 29/781* (2013.01); *H01L 29/7813* (2013.01)

(58) Field of Classification Search
CPC .............. H01L 29/045; H01L 29/1608; H01L 29/66068; H01L 29/781; H01L 29/7813; H01L 29/872; H01L 29/4236; H01L 29/42376; H01L 29/7802; H01L 29/7806; H01L 21/8224; H01L 21/82285;
(Continued)

(56) References Cited

U.S. PATENT DOCUMENTS 9,887,287 B1 * 2/2018 Lichtenwalner ............................ H01L 29/66068
10,763,356 B1   9/2020 Sundaresan et al.
(Continued)

OTHER PUBLICATIONS

T. Kimoto, J.A. Cooper in Fundamentals of Silicon Carbide Technology, IEEE Press (2014), 544 pages.

*Primary Examiner* — Cuong B Nguyen
(74) *Attorney, Agent, or Firm* — Raj S. Dave; Dave Law Group LLC

(57) ABSTRACT

An embodiment relates to a device comprising a first section and a second section. The first section comprises a first metal oxide semiconductor (MOS) interface comprising a first portion and a second portion. The first portion comprises a first contact with a horizontal surface of a semiconductor substrate and the second portion comprises a second contact with a trench sidewall of a trench region of the semiconductor substrate. The second section comprises one of a second metal oxide semiconductor (MOS) interface and a metal region. The second MOS interface comprises a third contact with the trench sidewall of the trench region. The metal region comprises a fourth contact with a first conductivity type drift layer. The first section and the second section are located contiguously within the device along a lateral direction.

17 Claims, 33 Drawing Sheets

Related U.S. Application Data division of application No. 17/007,014, filed on Aug. 31, 2020, now Pat. No. 11,444,152.

(51) Int. Cl.
*H01L 29/66* (2006.01)
*H01L 29/78* (2006.01)

(58) Field of Classification Search
CPC ............. H01L 27/0652; H01L 27/0658; H01L 27/0664; H01L 27/0716; H01L 27/0755–0777; H01L 27/0821; H01L 27/0823–0828; H01L 29/732–7327; H01L 29/7371–7378; H01L 29/66333–66348; H01L 29/7395–7398
See application file for complete search history.

(56) References Cited

U.S. PATENT DOCUMENTS

| | | |
|---|---|---|
| 11,004,940 B1 | 5/2021 | Sundaresan et al. |
| 2011/0039383 A1 | 2/2011 | Chen et al. |
| 2011/0291186 A1 | 12/2011 | Yilmaz et al. |
| 2022/0013639 A1* | 1/2022 | Tanaka ................ H01L 29/7806 |

* cited by examiner

INVERSION CHANNEL DEVICES ON MULTIPLE CRYSTAL ORIENTATIONS

CROSS REFERENCE TO RELATED APPLICATIONS

The present application is a divisional application of U.S. patent application Ser. No. 17/864,761 filed on Jul. 14, 2022, which is the divisional application of U.S. patent application Ser. No. 17/007,014 filed on Aug. 31, 2020 (U.S. Pat. No. 11,444,152, issued on Sep. 13, 2022), contents of which are hereby incorporated by reference in their entireties.

FIELD OF THE INVENTION

This disclosure relates to power semiconductor devices using a vertical double-implantation metal oxide semiconductor field-effect transistor (DMOSFET) or a trench UMOSFET. A power metal oxide semiconductor field-effect transistor (MOSFET) is a specific type of MOSFET designed to handle significant power levels.

BACKGROUND

FIG. 5a shows two implementations of a power MOSFET in the form of a vertical, planar DMOSFET and a vertical trench UMOSFET. The term DMOSFET derives from the silicon device of the same name, where the n+ source and p-base regions are formed by diffusion of n-type and p-type impurities through the same mask opening (hence "double diffused" MOSFET). In SiC, the same structure is formed by double implantation. The term UMOSFET derives from the U-shaped geometry but the term trench MOSFET is also used. Historically, the first SiC power MOSFETs were UMOSFETs, but they were joined soon by ion-implanted DMOSFETs. [SOURCE: T. Kimoto, J. A. Cooper in Fundamentals of Silicon Carbide Technology, IEEE Press (2014), pages 320-324.]

Because of their trench geometry, UMOSFETs present both opportunities and challenges relative to planar devices such as the DMOSFETs. The UMOSFET can be fabricated in a smaller surface area than the DMOSFET, since the MOS channel is oriented perpendicular to the surface. It is also easier to form a short sub-micron channel since the channel length is determined by epi-growth. However, the MOS channel is formed on an etched non-polar face of the crystal, and the properties of the gate oxide are different from those on the (1000) plane. The channel mobility or field effect mobility on the 0001 crystal plane tends to be lower as compared to the vertical side wall or what is called as the 11-20 or 10-10 crystal plane. The channel mobility can be in the range of 15-25 cm2/Vs on the 1000 plane whereas it can be as high as 60-80 cm2/Vs on the 11-20 or 10-10 crystal planes of SiC. [SOURCE: T. Kimoto, J. A. Cooper in Fundamentals of Silicon Carbide Technology, IEEE Press (2014), pages 320-324.]

FIGS. 5b and 5c show major resistances in the vertical DMOSFET and the UMOSFET respectively and it is apparent that the geometry of the device effectively eliminates the JFET resistance present in the DMOSFET. FIG. 5d illustrates the electric fields in the UMOSFET in the blocking state, the trench corners are significant locations of significant field crowding. Because the oxide field is ~2.5× higher than the peak field in the semiconductor (due to Gauss' law of electrostatics), this is a serious problem inherent to the UMOSFET device design. [SOURCE: T. Kimoto, J. A. Cooper in Fundamentals of Silicon Carbide Technology, IEEE Press (2014), pages 320-324.]

Therefore, there is a long-felt need to combine the desirable features of the planar DMOSFET and the trench UMOSFET into a single device that can be advantageously and flexibly designed to exploit the specific benefits of each device structure for a given application. Furthermore, there is a long-felt need to incorporate junction barrier Schottky (JBS) or merged PiN Schottky (MPS) rectifier elements into the hybrid DMOSFET/UMOSFET device geometry.

SUMMARY

Disclosed are one or more aspects of design and manufacture of power devices having inversion channels.

In one aspect, a device is described. The device comprises a first section and a second section. The first section comprises a first metal oxide semiconductor (MOS) interface. The second section comprises one of a second metal oxide semiconductor (MOS) interface and a metal region. The first MOS interface comprises a first portion and a second portion. The first portion comprises a first contact with a horizontal surface of a semiconductor substrate. The second portion comprising a second contact with a trench sidewall of a trench region of the semiconductor substrate. The second metal oxide semiconductor (MOS) interface comprising a third contact with the trench sidewall of the trench region. The metal region comprising a fourth contact with a first conductivity type drift layer. The first section and the second section are located contiguously within the device along a lateral direction.

In an embodiment, the horizontal surface of the semiconductor substrate is oriented along 11-20 crystal plane of 4H prototype of Silicon Carbide.

In another embodiment, the first section is located at a first location contiguously followed by the second section located at a second location within the device along the lateral direction.

In yet another embodiment, the second section is located at a first location contiguously followed by the first section located at a second location within the device along the lateral direction.

In yet another embodiment, the first section comprises an overlap region of a second conductivity type first well region and a second conductivity type second well region.

In yet another embodiment, the second section comprising the second MOS interface comprises a gap between a second conductivity type first well region and a second conductivity type second well region.

In yet another embodiment, the trench sidewall comprises a fifth contact with the first conductivity type drift layer through the gap between the second conductivity type first well region and the second conductivity type second well region.

In yet another embodiment, the first section comprises a second source region within a second conductivity type second well region.

In yet another embodiment, the second section comprising the second MOS interface comprises a first source region within a second conductivity type first well region In yet another embodiment, the second section comprising the metal region comprises an overlap region of a second conductivity type first well region and a second conductivity type second well region.

In yet another embodiment, the second section comprising the metal region further comprises the trench region that is completely contained within the second conductivity type second well region.

In yet another embodiment, the trench sidewall comprises a sidewall angle ranging from 30° to 90°.

In yet another embodiment, a depth of the trench region ranging from 0.2 µm to 2.0 µm.

In yet another embodiment, the first portion of the first MOS interface is positioned parallel to 0001 crystal plane of the semiconductor substrate.

In yet another embodiment, the first portion of the first MOS interface is positioned parallel to 11-20 crystal plane of the semiconductor substrate.

In yet another embodiment, the second portion of the first MOS interface is positioned parallel to one of 11-20 crystal plane of the semiconductor substrate, and 1-100 crystal plane of the semiconductor substrate.

In yet another embodiment, the trench sidewall comprises a sloped sidewall.

In yet another embodiment, the first portion of the first MOS interface is positioned parallel to one of 11-20 crystal plane and 0338 crystal plane of the semiconductor substrate, when the trench sidewall comprises the sloped sidewall.

In another aspect, a device is described. The device comprises at least two distinct source regions; at least two distinct second conductivity type well regions; a trench region that extends through a first source region of the at least two distinct source regions and a second conductivity type first well region of the at least two distinct second conductivity type well regions; and silicide layers formed on top of the at least two distinct source regions. A second source region of the at least two distinct source regions is confined within a second conductivity type second well region of the at least two distinct second conductivity type well regions. The second conductivity type second well region is positioned below the second conductivity type first well region. The second conductivity type second well region overlaps a portion of the second conductivity type first well region.

In an embodiment, a depth of the trench region ranging from 0.2 µm to 2.0 µm.

In another embodiment, the trench region comprises a trench sidewall.

In yet another embodiment, the trench sidewall comprises a sidewall angle ranging from 30° to 90°.

In yet another embodiment, the trench sidewall comprises a sloped sidewall.

In yet another embodiment, a first portion of a first MOS interface is positioned parallel to one of 11-20 crystal plane, and 0338 crystal plane of the semiconductor substrate, when the trench sidewall comprises the sloped sidewall.

In yet another aspect, a device is described. The device comprising at least two distinct second conductivity type well regions; a trench region that extends through a second conductivity type first well region of the at least two distinct second conductivity type well regions; a source region within a second conductivity type second well region of the at least two distinct second conductivity type well regions; a silicide layer formed on top of the source region; and a metal region that comprises a contact with a first conductivity type drift layer. The trench region is fully contained within the second conductivity type second well region of the at least two distinct second conductivity type well regions. The second conductivity type second well region is positioned below the second conductivity type first well region. The second conductivity type second well region overlaps a portion of the second conductivity type first well region.

In an embodiment, a depth of the trench region ranging from 0.2 µm to 2.0 µm.

In another embodiment, the trench region comprises a trench sidewall.

In yet another embodiment, the trench sidewall comprises a sidewall angle ranging from 30° to 90°.

In yet another aspect, a method is described. The method comprises preparing a semiconductor substrate comprising a first conductivity type substrate and a first conductivity type drift layer; forming a second conductivity type first well region by performing a second conductivity type implantation through a first patterned hard mask layer on the semiconductor substrate; forming a first source region within the second conductivity type first well region by performing a first conductivity type implantation through a second patterned mask layer on the semiconductor substrate; etching onto a top surface of the semiconductor substrate through a third patterned hard mask layer on the semiconductor substrate to form at least one trench; forming a first spacer region along all sidewalls of the at least one trench and the third patterned hard mask layer and selectively removing a portion of the first spacer region that are not in contact with the first source region; forming a second conductivity type second well region by performing a subsequent second conductivity type implantation at a predefined angle through the first spacer region on the semiconductor substrate; forming a second spacer region along all sidewalls of the at least one trench and the third patterned hard mask layer and selectively removing a portion of the second spacer region that are in contact with the second conductivity type first well region; forming a second source region within the second conductivity type second well region by performing a subsequent first conductivity type implantation through the second spacer region on the semiconductor substrate; removing the first spacer region, the second spacer region and the third patterned hard mask layer; and forming a metal oxide semiconductor field-effect transistor (MOSFET) comprising a drain terminal on a bottom side of the semiconductor substrate and a source terminal on a topside of the semiconductor substrate.

In an embodiment, forming the second conductivity type second well region by performing the subsequent second conductivity type implantation at the predefined angle through the first spacer region on the semiconductor substrate comprises: forming the second conductivity type second well region overlapping the second conductivity type first well region at a first section.

In another embodiment, forming the second source region within the second conductivity type second well region by performing the subsequent first conductivity type implantation through the second spacer region on the semiconductor substrate comprises: forming the second source region closer to a first section and far away from a second section.

In yet another aspect, a method is described. The method comprises preparing a semiconductor substrate comprising a first conductivity type substrate and a first conductivity type drift layer; forming a second conductivity type first well region by performing a second conductivity type implantation through a first patterned hard mask layer on the semiconductor substrate; etching onto a top surface of the semiconductor substrate through a second patterned hard mask layer on the semiconductor substrate to form at least one trench; forming a second conductivity type second well region by performing a subsequent second conductivity type implantation at a predefined angle; forming a first spacer region along all sidewalls of the at least one trench and the second patterned hard mask layer and selectively removing a portion of the first spacer region that are not in contact with a source region; forming the source region within the second conductivity type second well region by performing a subsequent first conductivity type implantation through the first spacer region on the semiconductor substrate; forming a metal region in contact with a first conductivity type drift layer; and forming a metal oxide semiconductor field-effect transistor (MOSFET) comprising a drain terminal on a bottom side of the semiconductor substrate and a source terminal on a topside of the semiconductor substrate.

In an embodiment, forming the second conductivity type second well region by performing the subsequent second conductivity type implantation at the predefined angle comprises: forming the second conductivity type second well region overlapping the second conductivity type first well region at a first section and a second section.

In another embodiment, forming the source region within the second conductivity type second well region by performing the subsequent first conductivity type implantation through the first spacer region on the semiconductor substrate comprises: forming the source region closer to a first section and far away from a second section.

BRIEF DESCRIPTION OF THE FIGURES

The embodiments are illustrated by way of example and not limitation in the figures of the accompanying drawings, in which like references indicate similar elements and in which.

Figure 1:
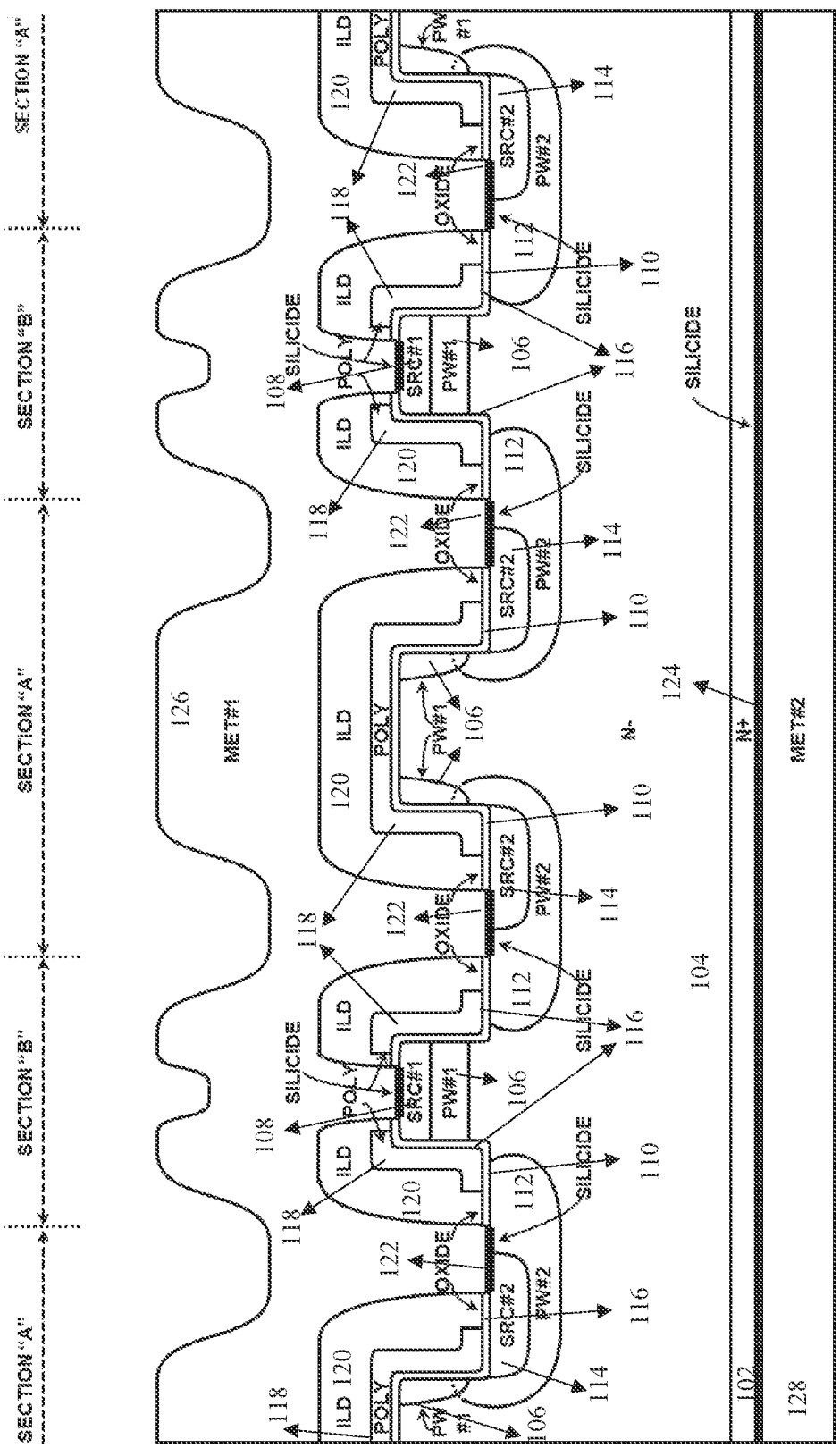
FIG. 1 illustrates an embodiment of a cross-sectional structure of one or more unit cells of a power MOSFET, a first unit cell of the one or more unit cells comprising a first metal oxide semiconductor (MOS) interface on a horizontal surface of a semiconductor substrate and a trench sidewall, and a second unit cell of the one or more unit cells comprising a second metal oxide semiconductor (MOS) interface formed solely on the trench sidewall.

Other features of the present embodiments will be apparent from the accompanying drawings and from the detailed description that follows.

DETAILED DESCRIPTION

Definitions and General Techniques

Unless otherwise defined herein, scientific and technical terms used herein shall have the meanings that are commonly understood by those of ordinary skill in the art. Further, unless otherwise required by context, singular terms shall include pluralities and plural terms shall include the singular. Generally, nomenclatures used in connection with, and techniques of, semiconductor processing described herein are those well-known and commonly used in the art.

The methods and techniques described herein are generally performed according to conventional methods well known in the art and as described in various general and more specific references that are cited and discussed throughout the present specification unless otherwise indicated. The nomenclatures used in connection with, and the procedures and techniques of semiconductor device technology, semiconductor processing, and other related fields described herein are those well-known and commonly used in the art.

For simplicity and clarity of illustration, the drawing figures illustrate the general manner of construction, and descriptions and details of well-known features and techniques may be omitted to avoid unnecessarily obscuring the present disclosure. Additionally, elements in the drawing figures are not necessarily drawn to scale. For example, the dimensions of some of the elements in the figures may be exaggerated relative to other elements to help improve understanding of embodiments of the present disclosure. The same reference numerals in different figures denotes the same elements.

No element, act, or instruction used herein should be construed as critical or essential unless explicitly described as such. Also, as used herein, the articles "a" and "an" are intended to include items, and may be used interchangeably with "one or more." Furthermore, as used herein, the term "set" is intended to include items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

As defined herein, two or more elements are "integral" if they are comprised of the same piece of material. As defined herein, two or more elements are "non-integral" if each is comprised of a different piece of material.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the apparatus, methods, and/or articles of manufacture described herein are, for example, capable of operation in other orientations than those illustrated or otherwise described herein The following terms and phrases, unless otherwise indicated, shall be understood to have the following meanings.

The term "unit cell" as used herein refers to a piece of a pattern in a semiconductor which is repeated in the semiconductor.

The term "SiC" as used herein refers to silicon carbide which is a compound semiconductor and is a mixture of silicon and carbon with the chemical formula SiC. Silicon is covalently bonded with carbon. In 4H-SiC, 4H is written in the Ramsdell classification scheme where the number indicates the layer and the letter indicates the Bravais lattice. That means in a 4H-SiC structure four hexagonal layers of SiC are present. SiC exists in a kind of polymorphic crystalline building known as a polytype, e.g. 3C-SiC, 4H-SiC, 6H-SiC. Presently 4H-SiC is used in power device manufacturing.

The term "substrate" as used herein refers to the supporting material on or in which the components of an integrated circuit are fabricated or attached.

The term "MOSFET" as used herein refers to metal oxide semiconductor field-effect transistor. which is a four-terminal device with source (S), gate (G), drain (D) and body (B) terminals. The body of the MOSFET is frequently connected to the source terminal so making it a three-terminal device like field effect transistor.

The term "DMOSFET" as used herein refers to double-implantation metal oxide semiconductor field-effect transistor. A common physical structure of SiC MOSFETs is the planar double-implanted MOSFET in 4H-SiC (SiC-DMOSFET).

The term "dopant" as used herein refers to an impurity added from an external source to a material by diffusion, coating, or implanting into a substrate, and changing the properties thereof. In semiconductor technology, an impurity may be added to a semiconductor to modify its electrical properties or to a material to produce a semiconductor having desired electrical properties. N-type (negative) dopants (e.g., such as phosphorus for a group IV semiconductor) typically come from group V of the periodic table. When added to a semiconductor, n-type dopants create a material that contains conduction electrons. P-type (positive) dopants (e.g., such as boron for a group IV semiconductor) typically come from group III and result in conduction holes (i.e., vacancies in the electron shells).

The term "drain" as used herein refers to the electrode of a field effect transistor which receives charge carriers which pass through the transistor channel from the source electrode.

The term "source" as used herein refers to the active region/electrode to which the source of charge carriers is connected in a field effect transistor, The term "gate" as used herein refers to the control electrode or control region that exerts an effect on a semiconductor region directly associated therewith, such that the conductivity characteristic of the semiconductor region is altered in a temporary manner, often resulting in an on-off type switching action. The control electrode or control region of a field effect transistor is located between the source and drain electrodes, and regions thereof.

The term "topside" as used herein refers to outer side/top of the MOSFET. The topside of the vertical MOSFET may comprise a source terminal.

The term "bottom side" as used herein refers to underside/base of the MOSFET. The bottom side of the vertical MOSFET may comprise a drain terminal.

The term "impurity" as used herein refers to a foreign material present in a semiconductor crystal, such as boron or arsenic in silicon, which is added to the semiconductor to produce either p-type or n-type semiconductor material, or to otherwise result in material whose electrical characteristics depend on the impurity dopant atoms.

The term "trench sidewalls" as used herein refers to walls that form sides of the trench region.

The term "bottom portion" as used herein refers to base of the trench region.

The term "crystal plane" as used herein refers to imaginary plane inside a crystal of a semiconductor substrate in which large concentration of atoms are present.

The term "MOS interface" as used herein refers to a region/path that electrically interconnects two regions.

The term "horizontal surface" as used herein refers to an unetched surface on topside of the semiconductor substrate.

The term "PN junction" as used herein refers to the interface and region of transition between p-type and n-type semiconductors.

The term "polysilicon" as used herein refers to a polycrystalline form of silicon.

The term "p-type" as used herein refers to extrinsic semiconductor in which the hole density exceeds the conduction electron density.

The term "channel" as used herein refers to a path for conducting current between a source and drain of a field effect transistor.

The term "chip" as used herein refers to a single crystal substrate of semiconductor material on which one or more active or passive solid-state electronic devices are formed. A chip may contain an integrated circuit. A chip is not normally ready for use until packaged and provided with external connectors.

The term "contact" as used herein refers to the point or part of a conductor which touches another electrical conductor or electrical component to carry electrical current to or from the conductor or electrical component.

The term "drift layer" as used herein refers to lightly doped region to support the high voltage in power MOSFET.

The term "well" used herein refers certain regions in a metal-oxide-semiconductor (MOS) transistor. MOS transistors are always created in a "well" region. A PMOS (positive-channel MOS) transistor is made in an N-doped region, called "n-well" region. Similarly, an NMOS transistor (negative-channel MOS) is made in a "p-type" region called "p-well". This ensures that the leakage between two transistors, through the bottom side, is low due to the reverse bias between the transistor areas and the well region.

The term "device" as used herein refers to the physical realization of an individual electrical element in a physically independent body which cannot be further divided without destroying its stated function.

The term "surface" as used herein refers to the outer or exterior boundary of a thing.

The term "trench" as used herein refers to electrical isolation of electronic components in a monolithic integrated circuit by the use of grooves or other indentations in the surface of the substrate, which may or may not be filled with electrically insulative (i.e., dielectric) material.

The term "dielectric" as used herein refers to a non-conductor of electricity, otherwise known as an insulator.

The term "ILD" as used herein refers to interlayer dielectric material used to electrically separate closely spaced interconnect lines arranged in several levels (multilevel metallization) in an advanced integrated circuit.

The term "work function" as used herein refers to minimum quantity of energy required to remove an electron to infinity from the surface of a given metal.

The term "mobility" as used herein refers to the facility with which carriers move through a semiconductor when subjected to an applied electric field. Electrons and holes typically have different mobilities in the same semiconductor.

The term "RIE" as used herein refers to reactive ion etching which is an etching technology used in microfabrication. RIE is a type of dry etching which has different characteristics than wet etching. RIE uses chemically reactive plasma to remove material deposited on wafers. The plasma is generated under low pressure (vacuum) by an electromagnetic field. High-energy ions from the plasma attack the wafer surface and react with it.

The term "ICP" as used herein refers to inductively coupled plasma etching technology often used in specialty semiconductor markets for device manufacturing. This technology can combine both chemical reactions and ion-induced etching. The independent control of ion flux enables high process flexibility. ICP etching is based on the use of an inductively coupled plasma source. The ICP source generates a high-density plasma due to inductive coupling between the RF antenna and the plasma. The antenna, located in the plasma generation region, creates an alternating RF magnetic field and induces RF electric fields, which energize electrons that participate in the ionization of gas molecules and atoms at low pressure. Due to the absence of an electric field near the reactor walls there is virtually no ion bombardment or erosion of the walls.

The term "CVD" as used herein refers to chemical vapor deposition is method used to produce high quality, high-performance, solid materials, typically under vacuum. The process is often used in the semiconductor industry to produce thin films. In typical CVD, the wafer (substrate) is exposed to one or more volatile precursors, which react and/or decompose on the substrate surface to produce the desired deposit. Frequently, volatile by-products are also produced, which are removed by gas flow through the reaction chamber.

The term "RF" as used herein refers to Radio frequency. Radio frequency is an oscillation rate of an alternating electric current or voltage or of a magnetic, electric or electromagnetic field or mechanical system.

The terms "first conductivity type region" and "second conductivity type region" as used herein, are used to describe n-type and p-type regions respectively for a N type device. For a P type device "first conductivity type region" and "second conductivity type region" are used to describe p-type and n-type regions respectively.

Embodiments relate to MOSFET power device having inversion channels.

An embodiment relates to the MOSFET comprising a first metal oxide semiconductor (MOS) interface at a first section and a second metal oxide semiconductor (MOS) interface at a second section.

An embodiment relates to the MOSFET comprising the first metal oxide semiconductor (MOS) interface at the first section and a metal region formed adjacent to a first conductivity type layer at the second section.

An embodiment relates to the MOSFET comprising the first section and the second section arranged in at least one sequence along a lateral direction.

An embodiment relates to the MOSFET comprising a higher channel density.

An embodiment relates to the MOSFET comprising an effective channel mobility.

An embodiment relates to reducing differential on-resistance for a given chip size.

An embodiment relates to the MOSFET for minimizing specific on-resistance.

An embodiment relates to the MOSFET for adjusting short-circuit withstand time.

An embodiment relates to the MOSFET for adjusting unclamped inductive switching energy.

An embodiment relates to the MOSFET for adjusting gate threshold voltage stability.

An embodiment relates to the MOSFET for increasing effective channel length for a given on-resistance target.

An embodiment relates to the MOSFET comprising the first metal region in direct contact with a first conductivity type drift layer.

An embodiment relates to the MOSFET comprising the first MOS interface comprising a first contact with a horizontal surface of a semiconductor substrate and a second contact with a trench sidewall of a trench region.

An embodiment relates to the MOSFET comprising the second MOS interface comprising a third contact solely with the trench sidewall of the trench region.

An embodiment relates to the formation of the second MOS interface at the second section, in which the trench region is in contact with the first conductivity type drift layer through a gap between a second conductivity type first well region and a second conductivity type second well region.

An embodiment relates to the MOSFET comprising the metal region at the second section, in which the trench region is not in contact with the first conductivity type drift layer.

An embodiment relates to the MOSFET comprising the metal region at the second section, in which the second conductivity type first well region and the second conductivity type second well region encloses bottom portion of the trench region.

An embodiment relates to the MOSFET, in which the second conductivity type first well region and the second conductivity type second well region overlaps at the first section.

An embodiment relates to the MOSFET, in which the second conductivity type first well region and the second conductivity type second well region overlaps at the first section and the second section.

FIG. 1 illustrates an embodiment of a cross-sectional structure of one or more unit cells of a power MOSFET, a first unit cell of the one or more unit cells comprising a first metal oxide semiconductor (MOS) interface on a horizontal surface of a semiconductor substrate and a trench sidewall, and a second unit cell of the one or more unit cells comprising a second metal oxide semiconductor (MOS) interface formed solely on the trench sidewall. The MOS- FET (shown in FIG. 1) is a n-type MOSFET. For the n-type MOSFET, the terms "first conductivity type" and "second conductivity type", are used to describe n-type and p-type respectively. In an embodiment, the MOSFET is a p-type MOSFET. For the p-type MOSFET, the terms "first conductivity type" and "second conductivity type", are used to describe p-type and n-type respectively.

The MOSFET (shown in FIG. 1) comprises the semiconductor substrate. The semiconductor substrate comprises a N+ substrate 102 (i.e. a first conductivity type substrate) and a N-drift layer 104 (i.e. a first conductivity type drift layer). In an embodiment, the semiconductor substrate comprises a silicon carbide (SiC) substrate. The MOSFET comprises a first section and a second section that are contiguously located along a lateral direction within the MOSFET. The first section comprises the first metal oxide semiconductor (MOS) interface, and the second section comprises the second metal oxide semiconductor (MOS) interface. The first section and the second section are arranged in at least one sequence from left to right or right to left.

In an embodiment, the at least one sequence comprises the first section (i.e. section A as shown in FIG. 1) at a first location and the second section (i.e. section B as shown in FIG. 1) at a second location along the lateral direction. In another embodiment, the at least one sequence comprises the second section at the first location and the first section at the second location along the lateral direction. In yet another embodiment, the at least one sequence comprises the first section at the first location and the second location along the lateral direction. In yet another embodiment, the at least one sequence comprises the second section at the first location and the second location along the lateral direction. In yet another embodiment, at the least one sequence comprises the first section at the first location and a third location, and the second section at the second location along the lateral direction. In yet another embodiment, at the least one sequence comprises the second section at the first location and the third location, and the first section at the second location along the lateral direction. For example, assume the first section as 'A' and the second section as 'B', then the at least one sequence comprises 'AB', 'BA', 'AA', 'BB', 'ABA', 'AAB', 'BAA', 'ABB', 'BAB', 'BBA', 'ABAB', 'ABBA', 'BAAB', etc.

The MOSFET comprises a first P-well region 106 (i.e. a second conductivity type first well region), a second P-well region 112 (i.e. a second conductivity type second well region), a first source region 108, a second source region 114 and a trench region 110. The first source region 108 and the second source region 114 are two distinct source regions. Similarly, the first P-well region 106 and the second P-well region 112 are two distinct well regions. The first source region 108 is positioned (e.g. confined) within the first P-well region 106. The second source region 114 is positioned (e.g. confined) within the second P-well region 112. The second source region 114 and the second P-well region 112 are positioned closer to the first section and far away from the second section. The second P-well region 112 overlaps the first P-well region 106 at the first section. The MOSFET comprises a gap between the first P-well region 106 and the second P-well region 112 at the second section. The second P-well region 112 do not overlaps the first P-well region 106 at the second section. The trench region 110 is extended through the first P-well region 106 and the first source region 108. The trench region 110 comprises a contact with the N-drift layer 104 through the gap between the first P-well region 106 and the second P-well region 112. The MOSFET comprises silicide layers 122, 124 on top of the first source region 108, the second source region 114 and bottom of the N+ substrate 102. The silicide layer 122 on top of the second source region 114 is partly positioned on top of the second P-well region 112.

The first section comprises the first metal oxide semiconductor (MOS) interface. The first MOS interface comprises a first portion and a second portion. The first portion comprises a first contact with a horizontal surface (e.g. an unetched surface) of the semiconductor substrate. In an embodiment, the first portion of the first MOS interface is positioned parallel to 0001 crystal plane of the semiconductor substrate. In another embodiment, the first portion of the first MOS interface is positioned parallel to 11-20 crystal plane of the semiconductor substrate. The second portion of the first MOS interface comprises a second contact with the trench sidewall of the trench region 110. In an embodiment, the second portion of the first MOS interface is positioned parallel to one of 11-20 crystal plane and 1-100 crystal plane of the semiconductor substrate. The first section comprises a combination of a planar MOSFET structure and a trench MOSFET structure. The second section comprises the second MOS interface. The second MOS interface comprises a third contact with the trench sidewall of the trench region 110. The second section comprises solely the trench MOSFET structure. The MOSFET (shown in FIG. 1), comprising the first section and the second section, comprises a higher channel density and reduced on-resistance of the MOSFET.

The trench region comprises the trench sidewall. In an embodiment, the trench sidewall of the trench region 110 comprises a sloped sidewall. The sloped sidewall comprises a sidewall angle ranging from 30° to 90°. In an embodiment, the trench region 110 comprises a depth ranging from 0.2 μm to 2.0 μm. A slope of the sloped sidewall is selected appropriately to orient the first MOS interface along a predefined crystal plane that comprises a low trap density. In an embodiment, the first portion of the first MOS interface is positioned parallel to one of 11-20 crystal plane and 0338 crystal plane of the sloped sidewall of the semiconductor substrate, when the trench sidewall comprises the sloped sidewall. The MOSFET comprising the sloped sidewall further comprises a higher channel mobility in addition to the higher channel density.

The MOSFET structure provides flexibility to a designer to increase/lower density of the first section comprising at least one of the trench MOSFET structure and the planar MOSFET structure, and the second section comprising the trench MOSFET structure alone. The density of the first section and the second section is increased or lowered depending on requirement of at least one of a specific on-resistance of the MOSFET and robustness metric such as a short-circuit withstand time, an unclamped inductive switching energy and a gate threshold voltage stability. The MOSFET shown in FIG. 1 further provides the flexibility to at least one of (a) increase an effective channel length for the given on-resistance and (b) reduce the on-resistance for a given chip size based on requirement.

Figure 2A:
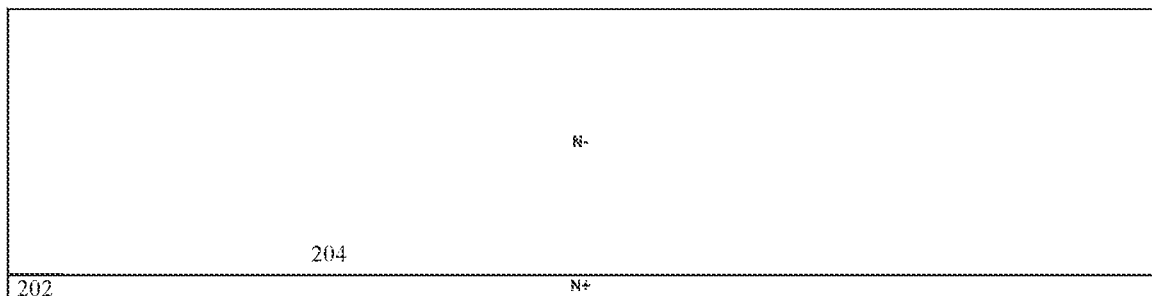
FIGS. 2a to 2ab are cross-sectional views illustrating an embodiment of a process of manufacturing the MOSFET structure shown in FIG. 1.
Figure 2B:
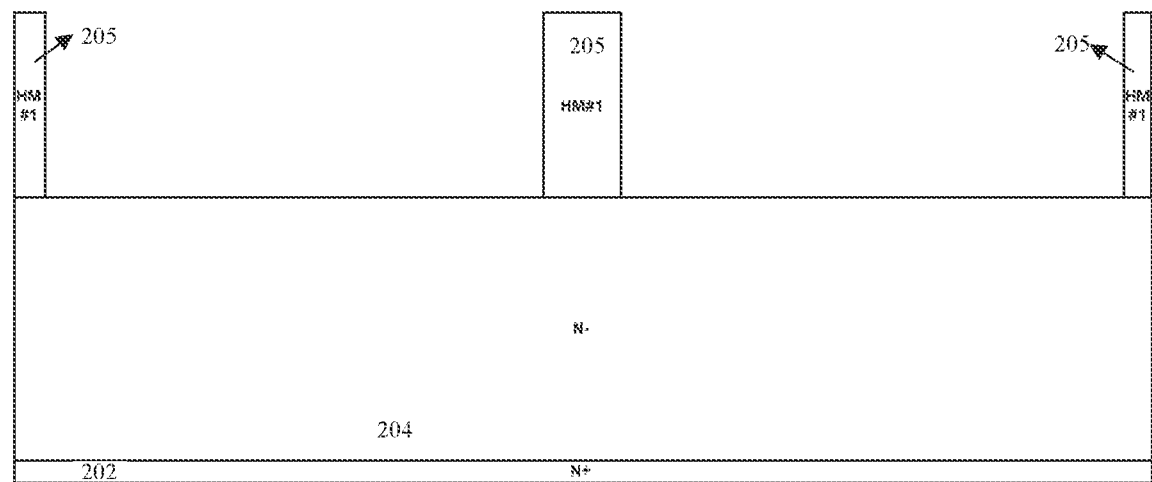
Figure 2C:
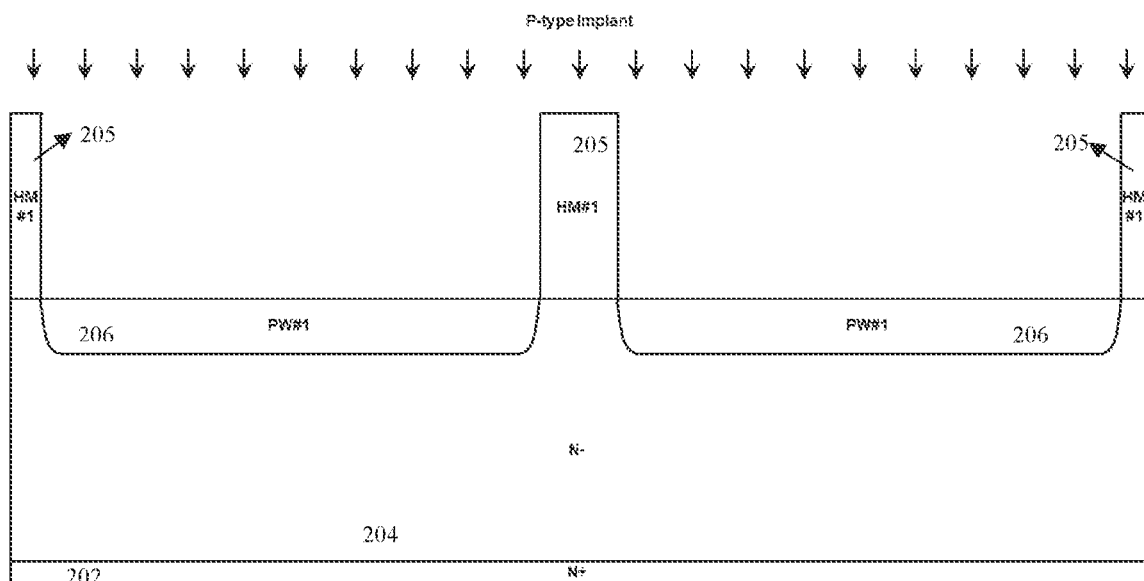
Figure 2D:
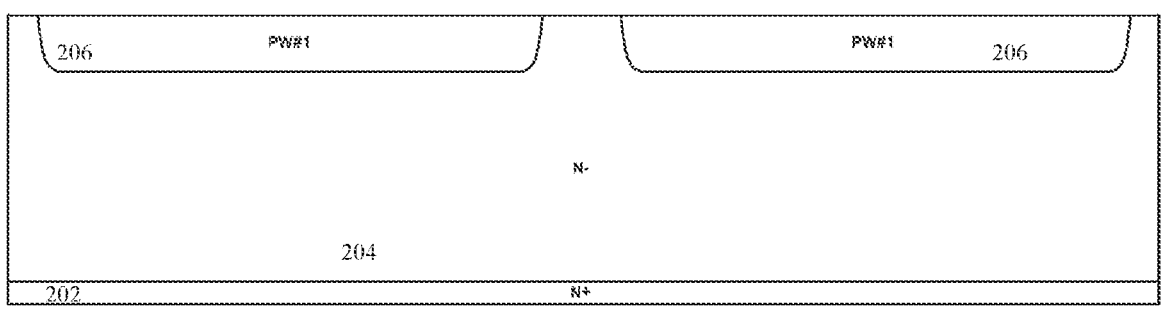

FIGS. 2a to 2ab are cross-sectional views illustrating an embodiment of a process of manufacturing the MOSFET structure shown in FIG. 1. The process of manufacturing the MOSFET structure shown in FIG. 1 comprises preparing a semiconductor substrate having a N+ substrate 202 (i.e. a first conductivity type substrate) and a N-drift layer 204 (i.e. a first conductivity type drift layer) as shown in FIG. 2a. The N-drift layer 204 is grown on top of the N+ substrate 202. The N+ substrate 202 comprises a heavily doped substrate. A first patterned hard mask layer 205 is formed on topside of the semiconductor substrate as shown in FIG. 2b. A first p-type ion implantation (e.g. Aluminum, Boron) is formed on the topside of the semiconductor substrate through the first patterned hard mask layer 205 to form a first p-well region 206 as shown in FIG. 2c. The first patterned hard mask layer 205 is then removed from the topside of the semiconductor substrate as shown in FIG. 2d. In an embodiment, the first p-well region 206 is formed by a first epitaxial growth using a p-type impurity (e.g. Aluminum, Boron) into the N-drift layer 204. The first P-well region 206 comprises a first predefined implantation energy and a first predefined dosage. In an embodiment, the first predefined implantation energy ranges from 5 keV to 5 MeV and the first predefined dosage ranges from 1E13 cm-2 to 5E16 cm-2. In another embodiment, the first P-well region 206 is formed using a first single ion-implantation step comprising combination of the predefined implantation energy and the predefined dosage. In yet another embodiment, the first P-well region 206 is formed using a first sequence of multiple ion-implantation steps. An ion-implantation step of the first sequence of multiple ion-implantation steps is performed with a different implantation energy or a different dosage. In an embodiment, the first P-type ion implantation (i.e. second conductivity type first ion implantation) is performed at one of room temperature and at elevated temperature up to 1000° C.

Figure 2E:
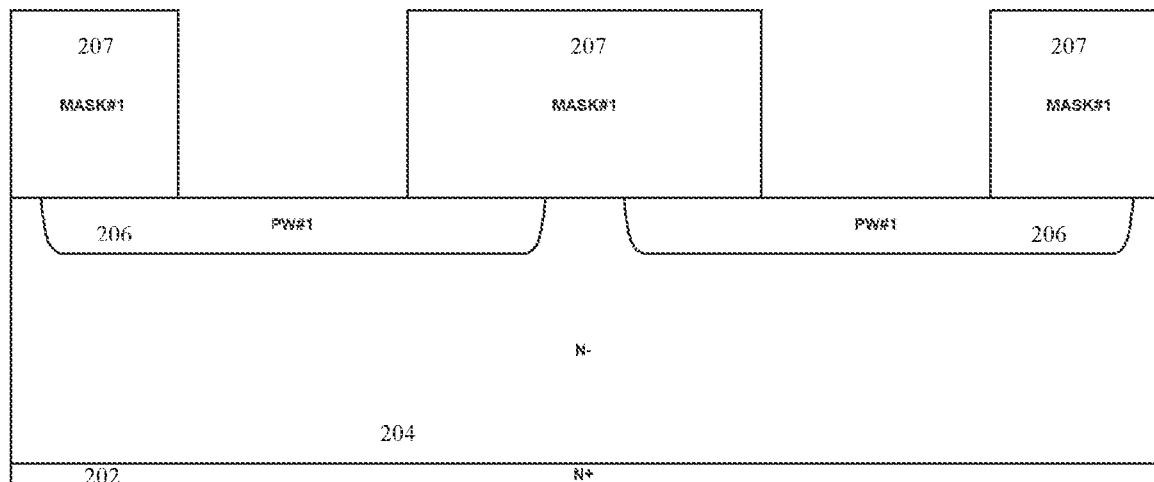
Figure 2F:
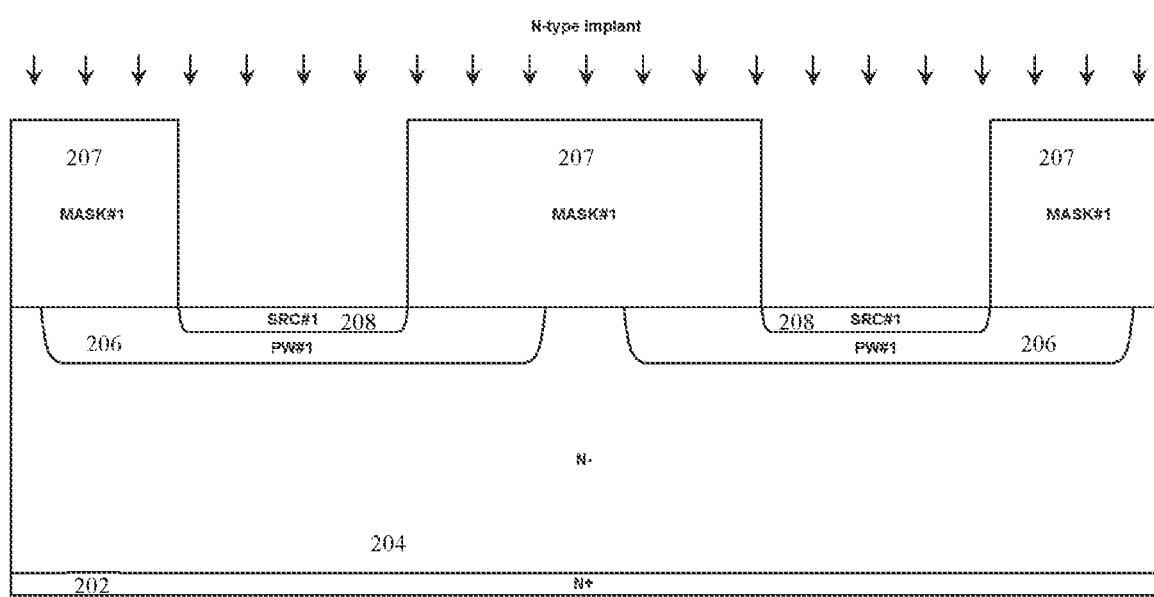
Figure 2G:
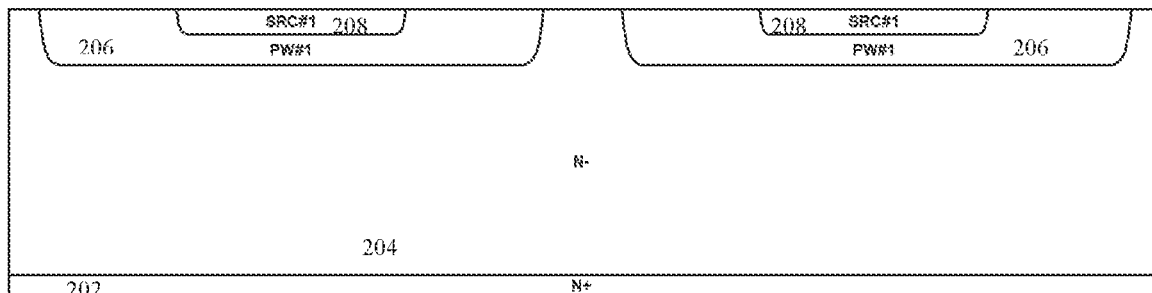

A second patterned masking layer 207 is formed on the topside of the semiconductor substrate as shown in FIG. 2e. A first n-type ion (e.g. Nitrogen, Phosphorous) implantation is formed on the topside of the semiconductor substrate through the second patterned masking layer 207 to form a first source region 208 within the first P-well region 206 as shown in FIG. 2f The second patterned masking layer 207 is then removed from the semiconductor substrate as shown in FIG. 2g. In an embodiment, the first source region 208 is formed by a second epitaxial growth using a n-type impurity (e.g. Nitrogen, Phosphorous) into the first P-well region 206. The first source region 208 comprises a second predefined implantation energy and a second predefined dosage. In an embodiment, the second predefined implantation energy ranges from 5 keV to 1 MeV and the second predefined dosage ranges from 5E13 cm-2 to 5E16 cm-2. In another embodiment, the first source region 208 is formed using a second single ion-implantation step comprising combination of the second predefined implantation energy and the second predefined dosage. In yet another embodiment, the first source region 208 is formed using a second sequence of multiple ion-implantation steps. An ion-implantation step of the second sequence of multiple ion-implantation steps is performed with a different implantation energy or a different dosage. In an embodiment, the first n-type ion implantation is performed at one of the room temperature and at the elevated temperature up to 1000° C.

Figure 2H:
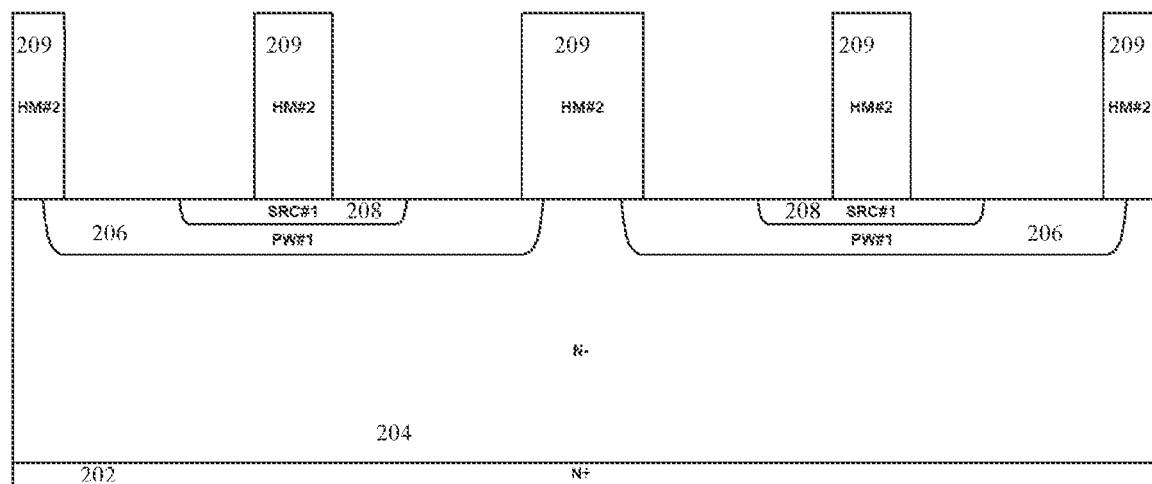
Figure 2I:
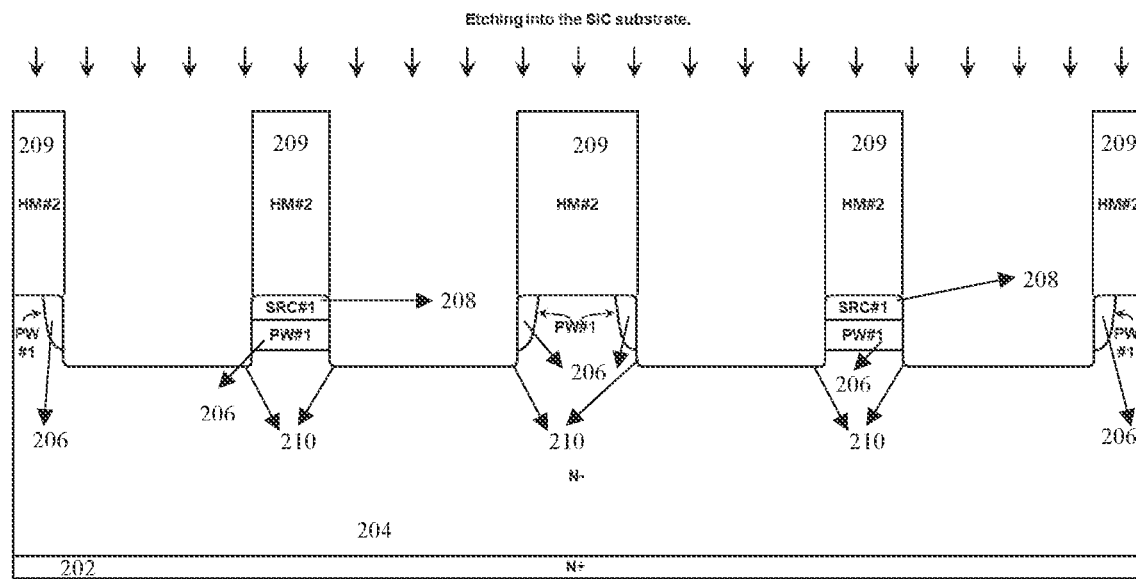

A third patterned hard mask layer 209 is formed on the topside of the semiconductor substrate as shown in FIG. 2h. A trench region 210 is then formed by performing etching onto the topside (e.g. a top surface) of the semiconductor substrate through the third patterned hard mask layer 209 as shown in FIG. 2i. In an embodiment the etching is performed using one of a reactive ion etching (RIE) and an inductively coupled plasma (ICP) etching. In another embodiment, the etching is controlled appropriately to form the trench region 210. The trench region 210 comprises a predefined depth and a predefined sidewall angle. The predefined depth of the trench region 210 ranges from 0.2 µm to 2.0 µm. The predefined sidewall angle ranges from 30° to 90°. The predefined depth of the trench region 210 is deeper than a depth of the first P-well region 206 (i.e. bottom portion of the trench region 210 may be in contact with the N-drift layer 204). The trench region 210 comprises a first section and a second section.

Figure 2J:
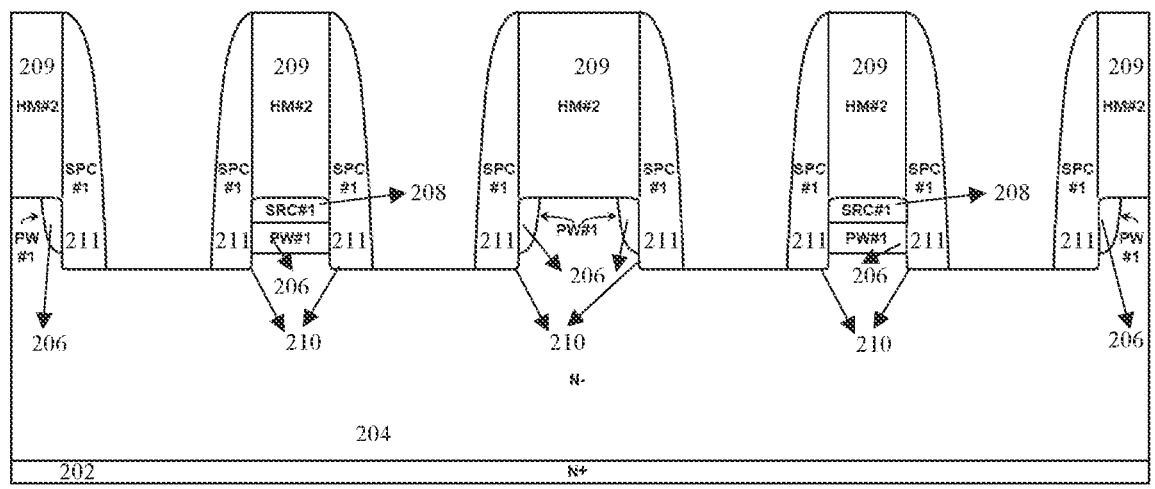
Figure 2K:
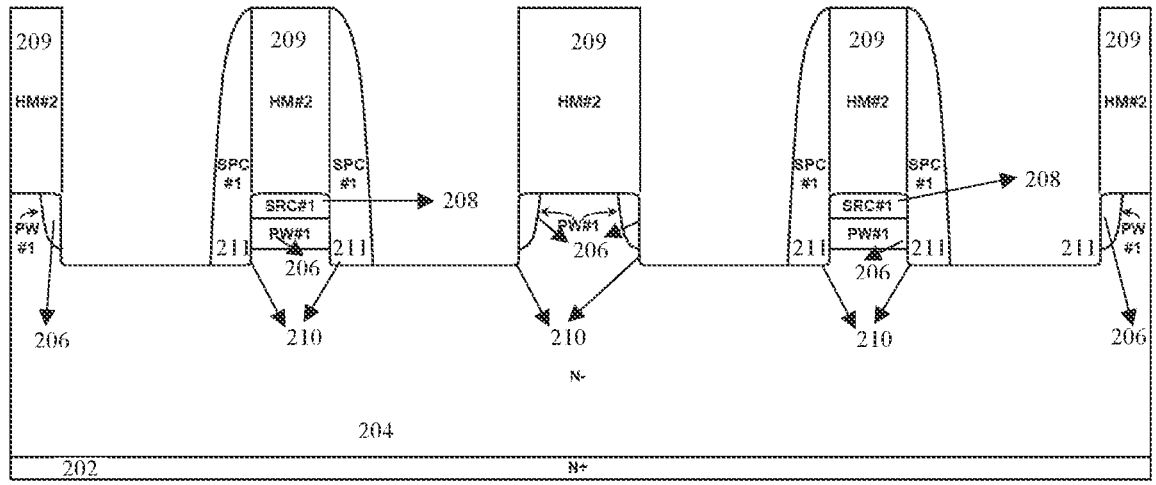

A first spacer 211 (i.e. sidewall spacer) is then formed on the semiconductor substrate along the trench sidewalls of the trench region 210 and the third patterned hard mask layer 209 as shown in FIG. 2j. In an embodiment, the first spacer 211 is formed using a dielectric material (e.g. silicon dioxide, silicon nitride). In an embodiment, the first spacer 211 and the hard mask layers (e.g. the first patterned hard mask layer 205, the second patterned hard mask layer 207) are formed using dis-similar dielectric materials to enable selective removal of one or more portions of the first spacer 211 without removal of the hard mask layers. The one or more portions of the first spacer 211, that are not in contact with the first source region 208, are selectively removed as shown in FIG. 2k.

Figure 2L:
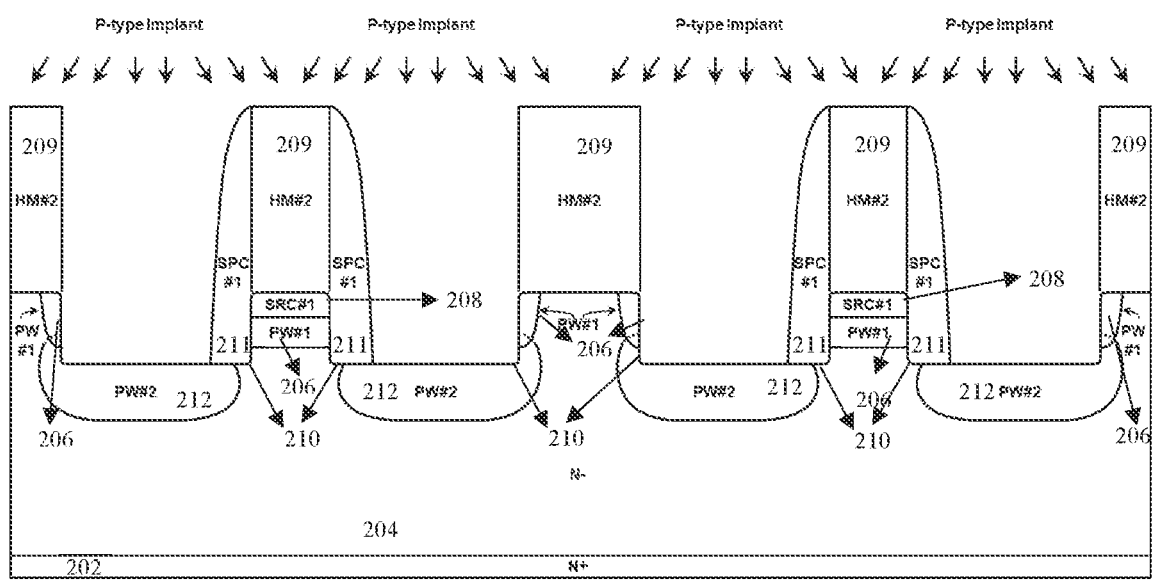

A second p-type ion implantation (e.g. Aluminum, Boron) is then performed to form a second P-well region 212 below the first P-well region 206 as shown in FIG. 2l. In an embodiment, the second p-type ion implantation (i.e. second conductivity type second ion implantation) comprises an angled implantation (i.e. at a predefined angle) to electrically short a portion of the second P-well region 212 and the first P-well region 206 at the first section. In an embodiment, the angled implantation is performed using a tilt angle away from normal incidence. The tilt angle for the angled implantation may range from 0° (normal incidence) to 60°. The second P-well region 212 comprises a third predefined implantation energy and a third predefined dosage. In an embodiment, the third predefined implantation energy ranges from 5 keV to 5 MeV and the third predefined dosage ranges from 5E13 cm-2 to 5E16 cm-2. In another embodiment, the second P-well region 212 is formed using a third single ion-implantation step comprising combination of the third predefined implantation energy and the third predefined dosage. In yet another embodiment, the second P-well region 212 is formed using a third sequence of multiple ion-implantation steps. An ion-implantation step of the third sequence of multiple ion-implantation steps is performed with a different implantation energy or a different dosage. In an embodiment, the second P-type ion implantation (i.e. the second conductivity type second ion implantation) is performed at one of the room temperature and the elevated temperature up to 1000° C.

Figure 2M:
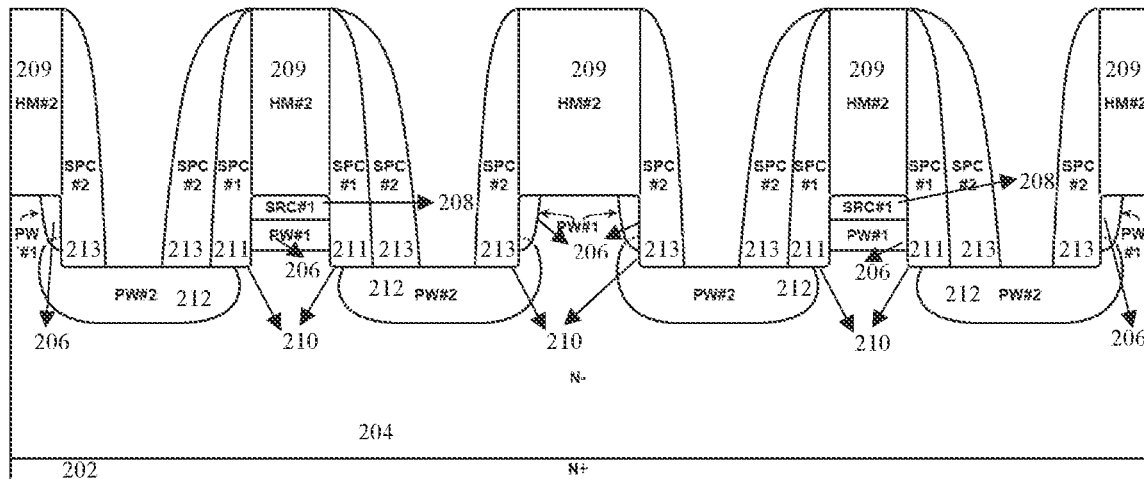
Figure 2N:
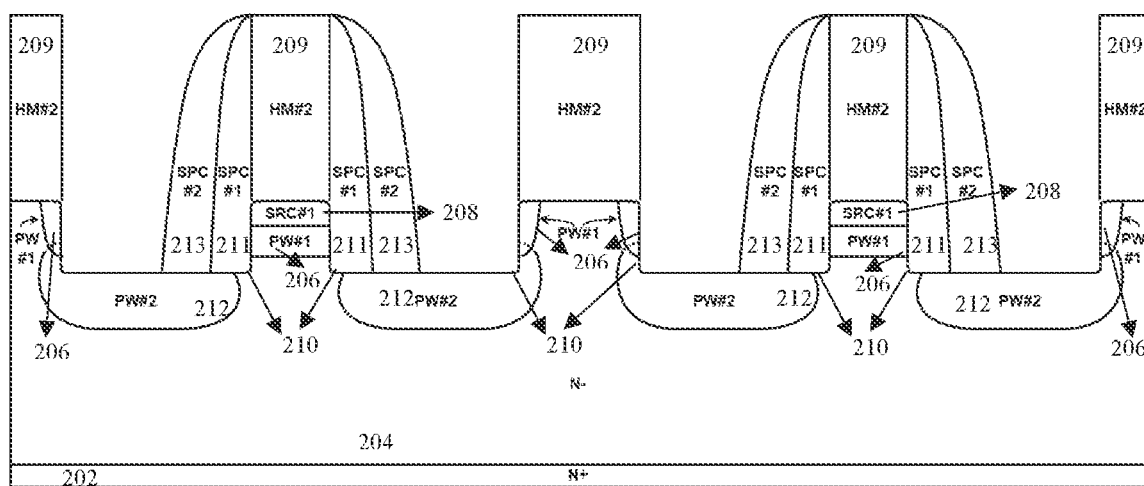
Figure 2O:
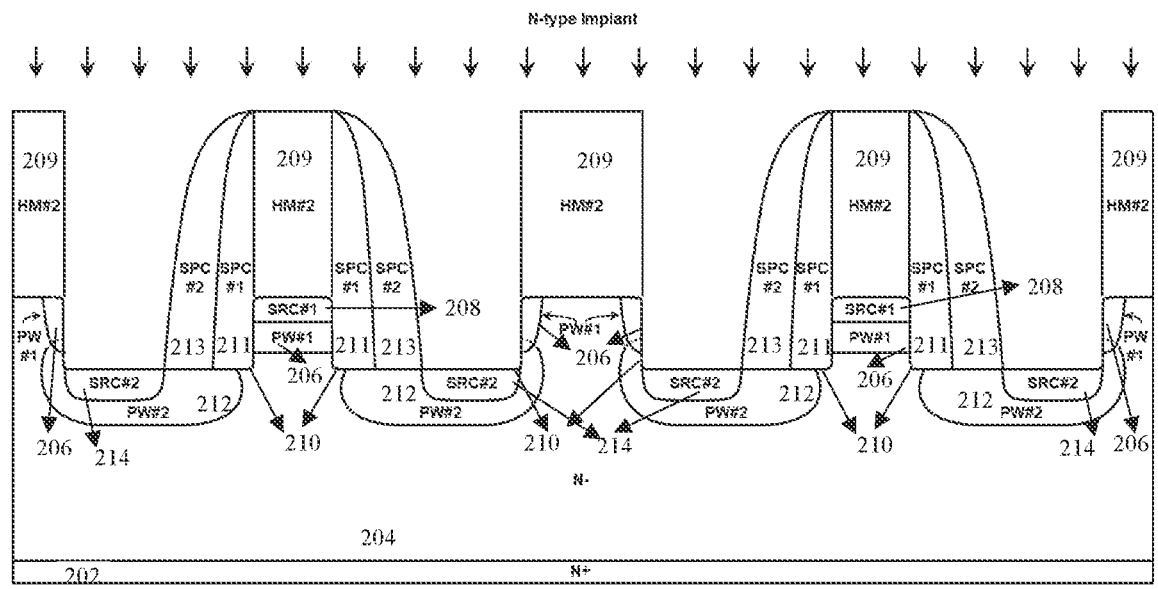

A second spacer 213 (i.e. sidewall spacer) is then formed on the semiconductor substrate along the trench sidewalls of the trench region 210 and the third patterned hard mask layer 209 as shown in FIG. 2m. One or more portions of the second spacer 213, that are in contact with the first p-well region 206 (i.e. in contact with the first section), are selectively removed as shown in FIG. 2n. A second n-type ion implantation (e.g. Nitrogen, Phosphorous) is then performed through the second spacer 213 to form a second source region 214 within the second P-well region 212 as shown in FIG. 2o. The second source region 214 and the second P-well region 212 are formed closer to the first section and far away from the second section. The second source region 214 comprises a fourth predefined implantation energy and a fourth predefined dosage. In an embodiment, the fourth predefined implantation energy ranges from 5 keV to 1 MeV and the fourth predefined dosage ranges from 5E13 cm-2 to 5E16 cm-2. In another embodiment, the second source region 214 is formed using a fourth single ion-implantation step comprising combination of the fourth predefined implantation energy and the fourth predefined dosage. In yet another embodiment, the second source region 214 is formed using a fourth sequence of multiple ion-implantation steps. An ion-implantation step of the fourth sequence of multiple ion-implantation steps is performed with a different implantation energy or a different dosage. In an embodiment, the second n-type ion implantation is performed at one of the room temperature and the elevated temperature up to 1000° C.

Figure 2P:
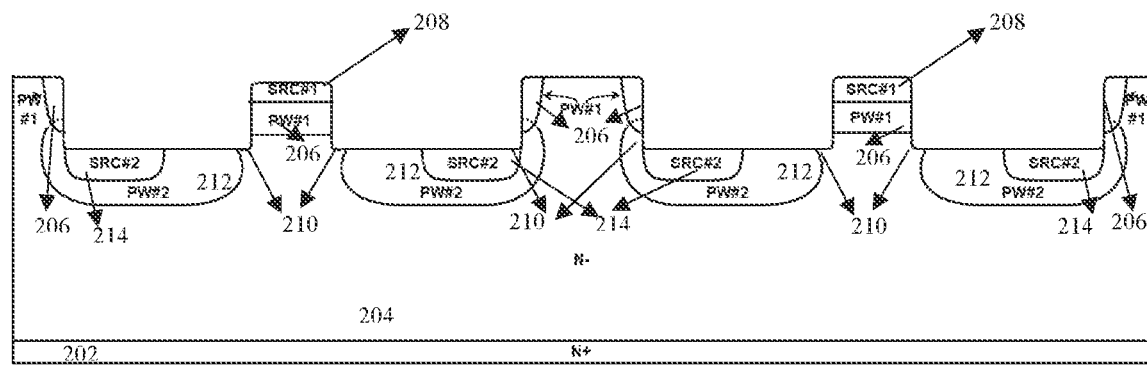
Figure 2Q:
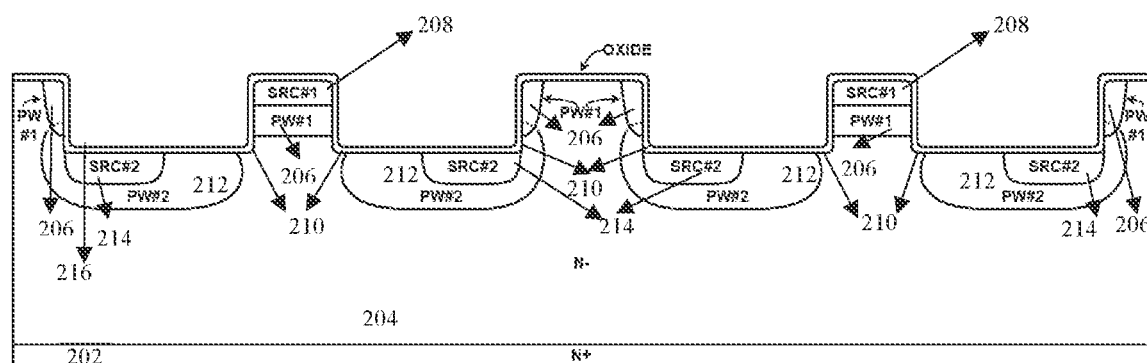
Figure 2R:
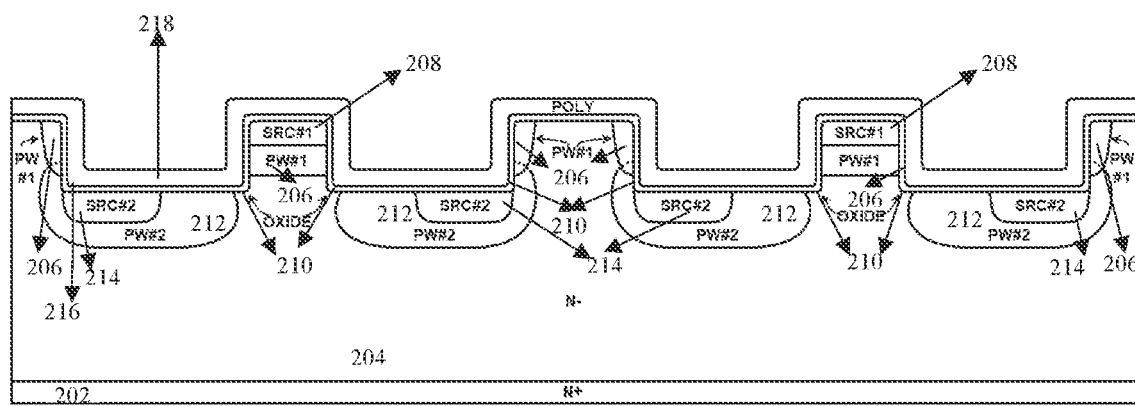
Figure 2S:
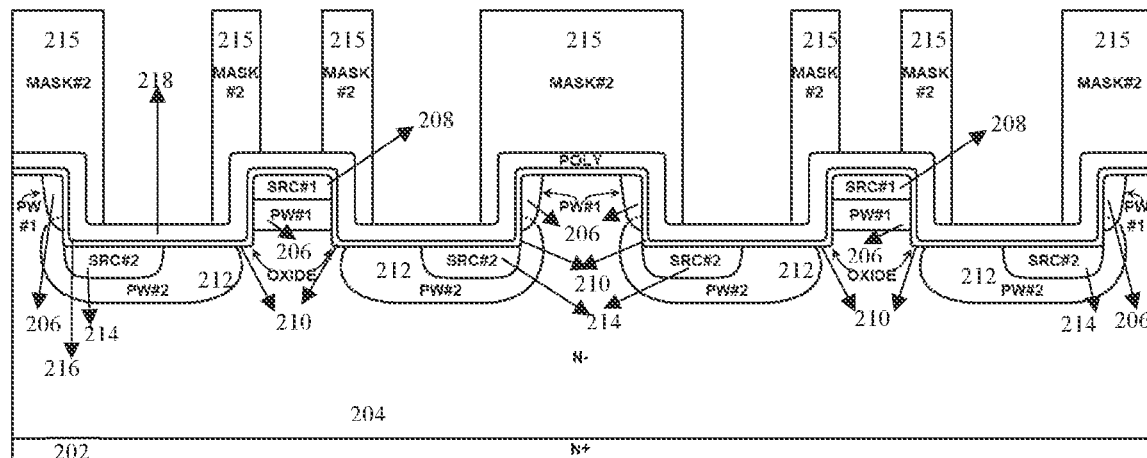
Figure 2T:
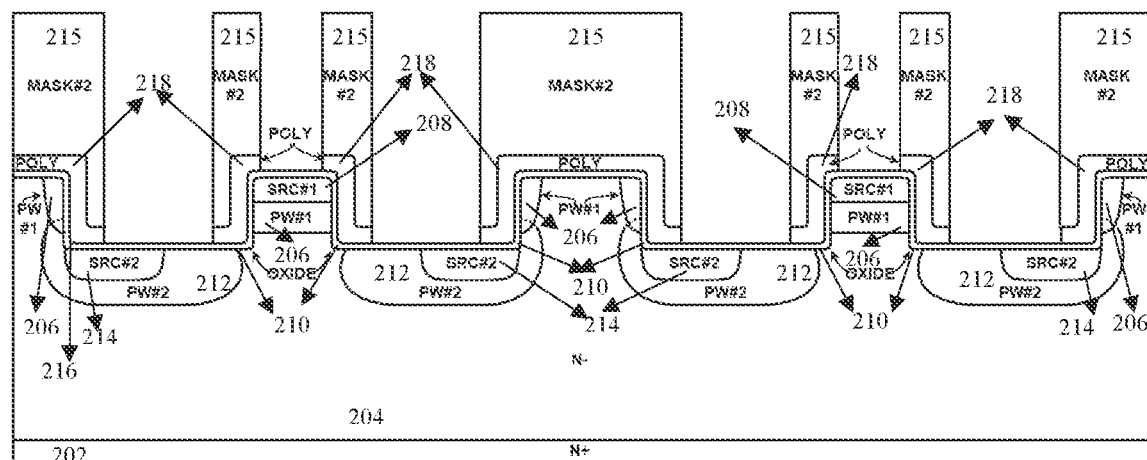
Figure 2U:
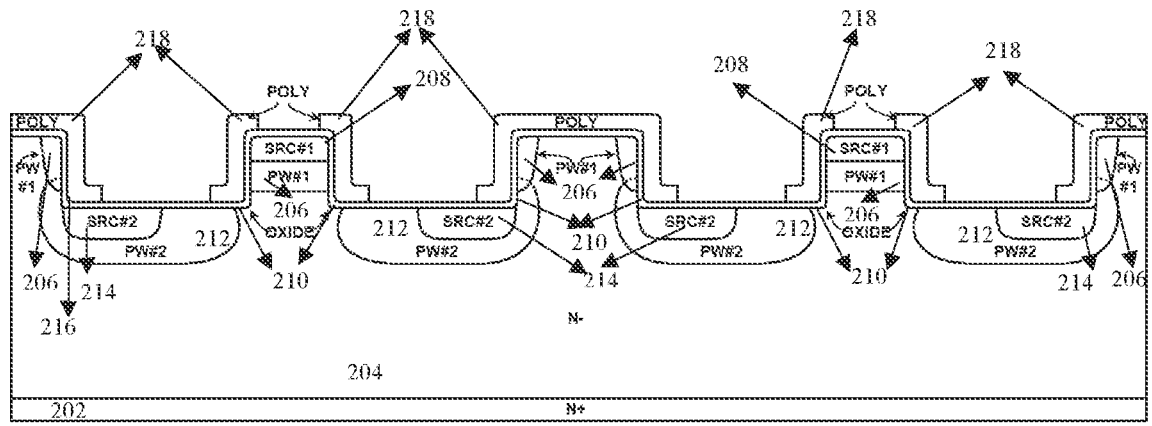
Figure 2V:
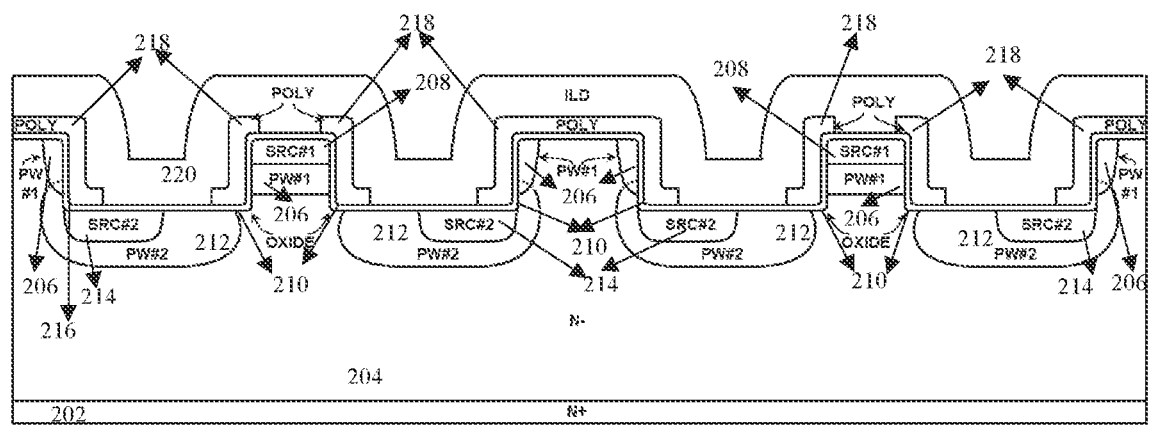
Figure 2W:
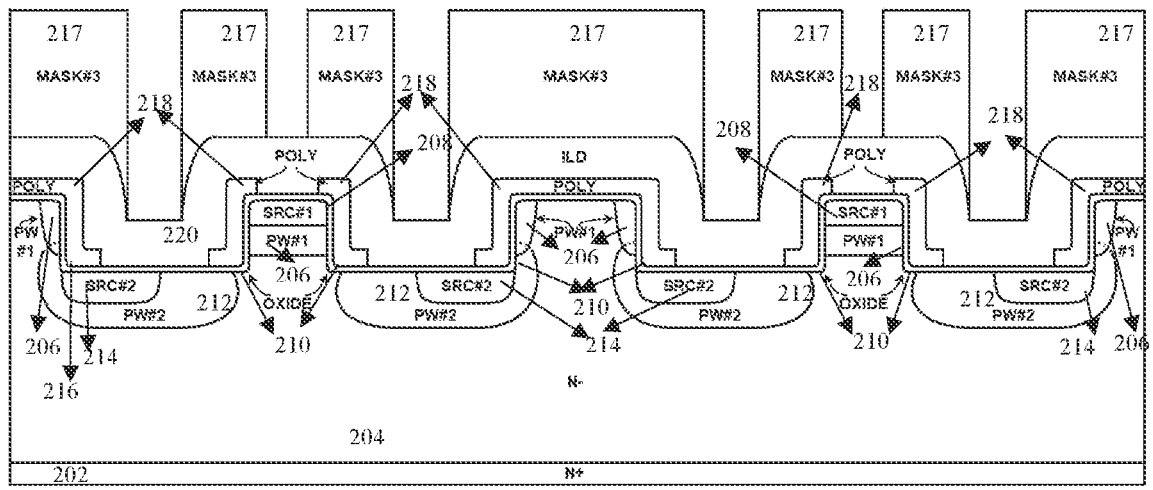
Figure 2X:
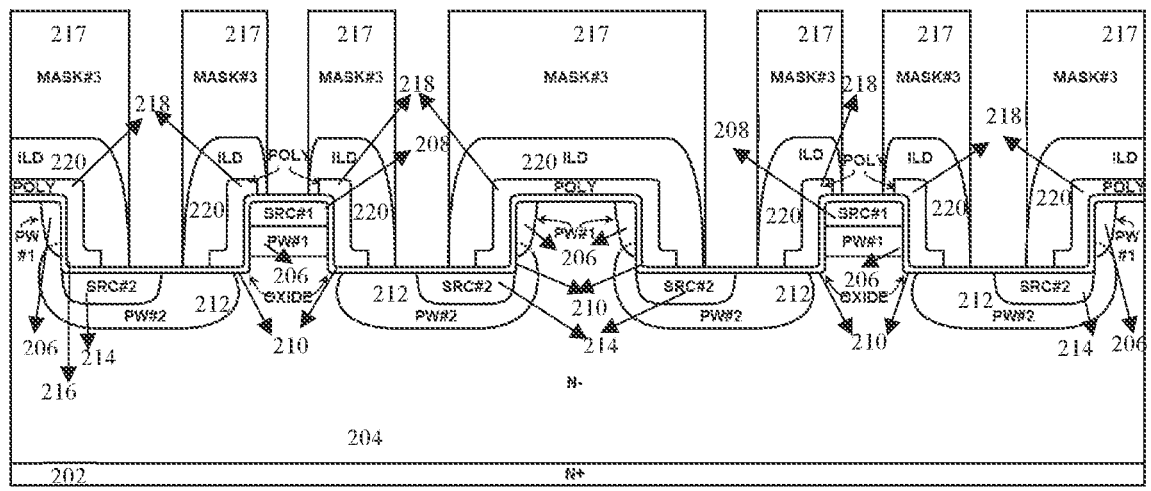
Figure 2Y:
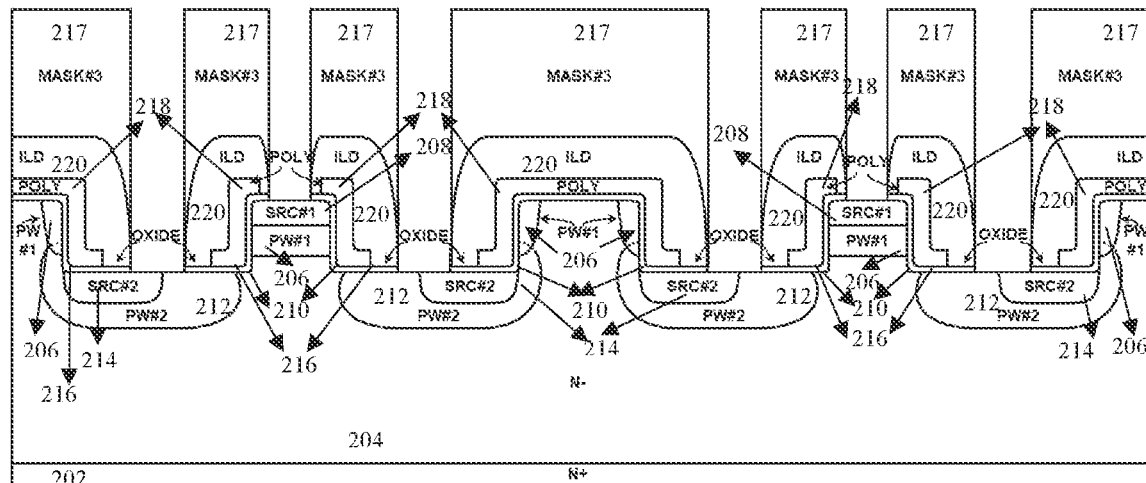
Figure 2Z:
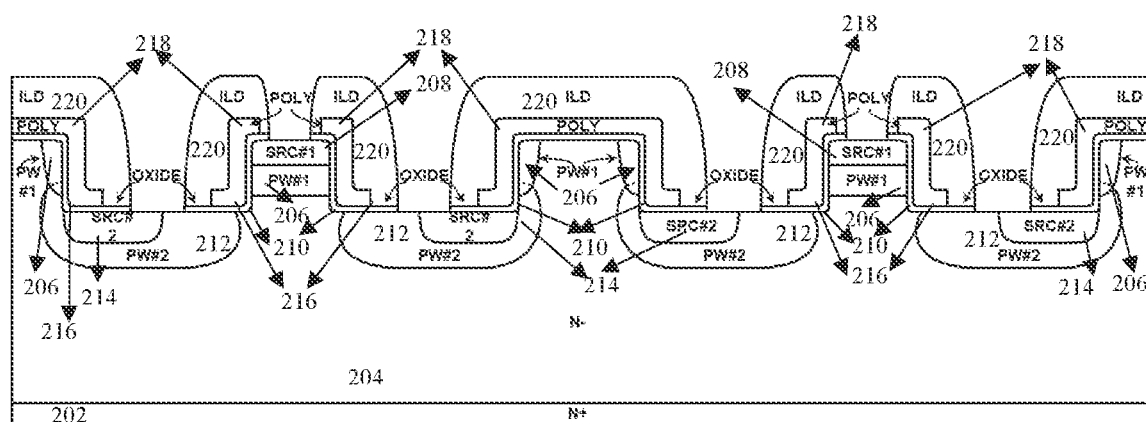
Figure 2A:
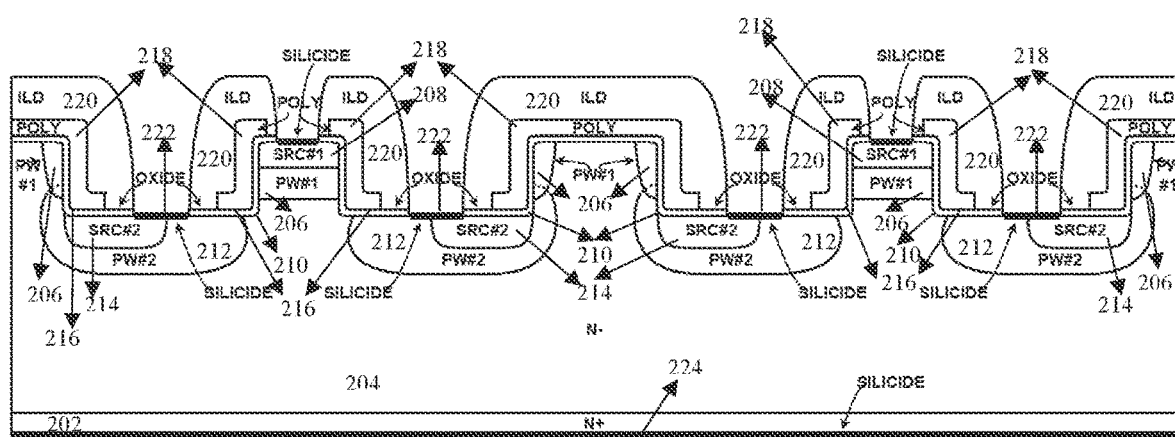
Figure 2A:
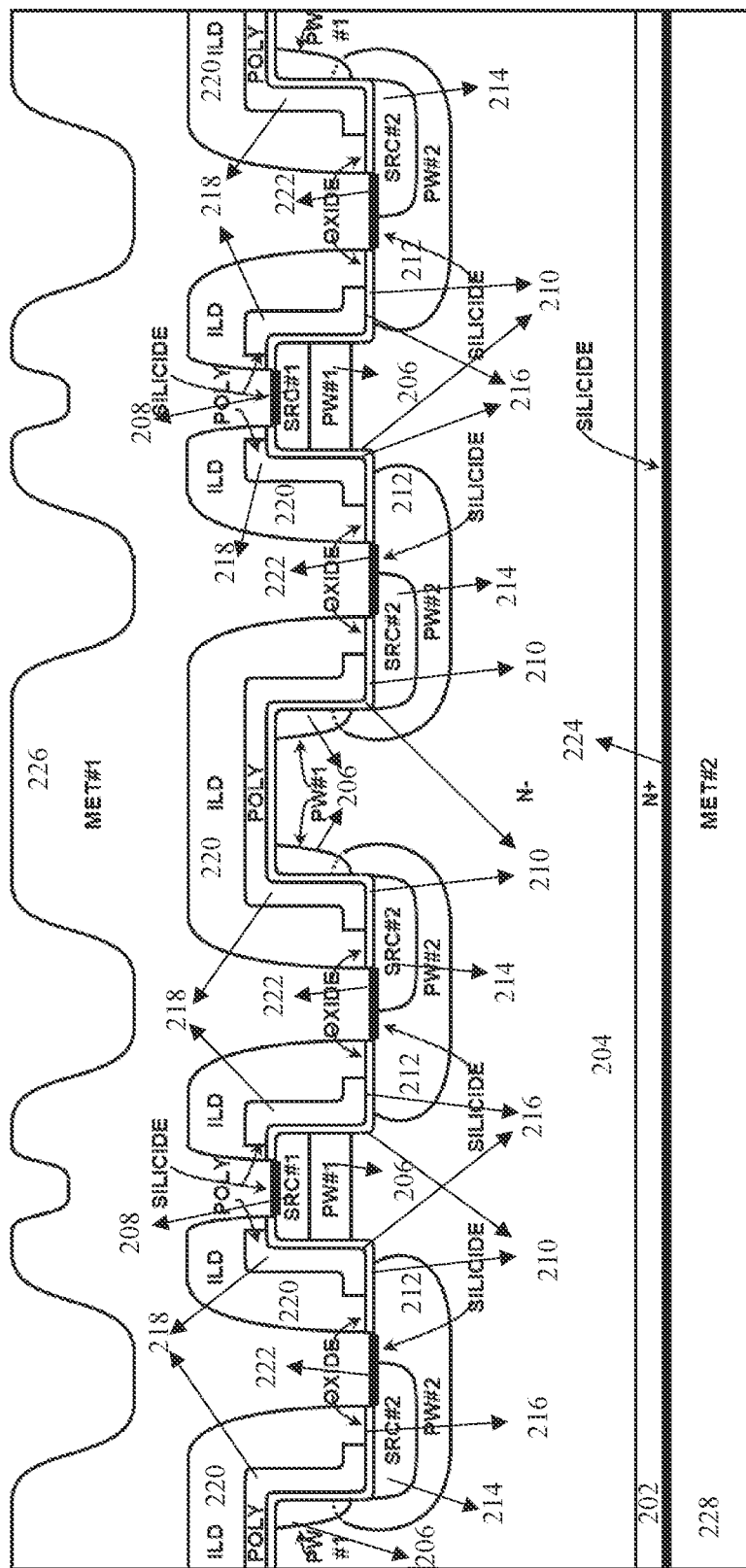

The hard mask layers (e.g. the first spacer 211, the second spacer 213, the third patterned hard mask layer 209) are removed as shown in FIG. 2*p*. The semiconductor substrate (e.g. wafers) is then subjected to high-temperature heat treatment for activating implanted ions and for implant damage alleviation. In an embodiment, the heat treatment or annealing is performed at a temperature ranging from 1700° C.-2000° C., for a duration ranging from 10 min to 2 hours. A gate dielectric layer 216 is then formed onto the topside of exposed portions of the semiconductor substrate as shown in FIG. 2*q*. In an embodiment, the gate dielectric layer 216 is an oxide layer. In another embodiment, the gate dielectric layer 216 is formed by one of a thermal oxidation and a chemical vapor deposition (CVD) of a dielectric layer (e.g. silicon dioxide, silicon nitride, silicon oxynitride, etc.). Then a poly silicon layer 218 is formed onto the topside of the semiconductor substrate as shown in FIG. 2*r*. In an embodiment, the poly silicon layer 218 comprises a n-type doped layer. The n-type doped layer is doped using a n-type dopant (e.g. phosphorous). A fourth patterned masking layer 215 is then formed on top of the poly silicon layer 218 as shown in FIG. 2*s*. The poly silicon layer 218 is then selectively etched using the fourth patterned masking layer 215 to form one or more poly silicon regions as shown in FIG. 2*t*. The fourth patterned masking layer 215 is removed as shown in FIG. 2*u*. Then an interlayer dielectric (ILD) 220 is formed onto the topside of the semiconductor substrate as shown in FIG. 2*v*. A fifth patterned masking layer 217 is formed on top of the interlayer dielectric (ILD) 220 as shown in FIG. 2*w*. The interlayer dielectric (ILD) 220 is then selectively etched using the fifth patterned masking layer 217 as shown in FIG. 2*x*. The gate dielectric layer 216 is also selectively etched using the fifth patterned masking layer 217 as shown in FIG. 2*y*. The fifth patterned masking layer 217 is then removed from the semiconductor substrate and the semiconductor substrate is exposed to air as shown in FIG. 2*z*. A first silicide region 222 and a second silicide region 224 are then formed on the topside and bottom side of the semiconductor substrate to form a source terminal and a drain terminal respectively as shown in FIG. 2*aa*. The first silicide region 222 is formed on top of the first source region 208 and the second source region 214. The second silicide region 224 is formed on bottom of the N+ substrate 202. A first inter-connect metal layer 226 and a second inter-connect metal layer 228 is then formed on the topside and the bottom side of the semiconductor substrate respectively as shown in FIG. 2*ab*.

Figure 3:
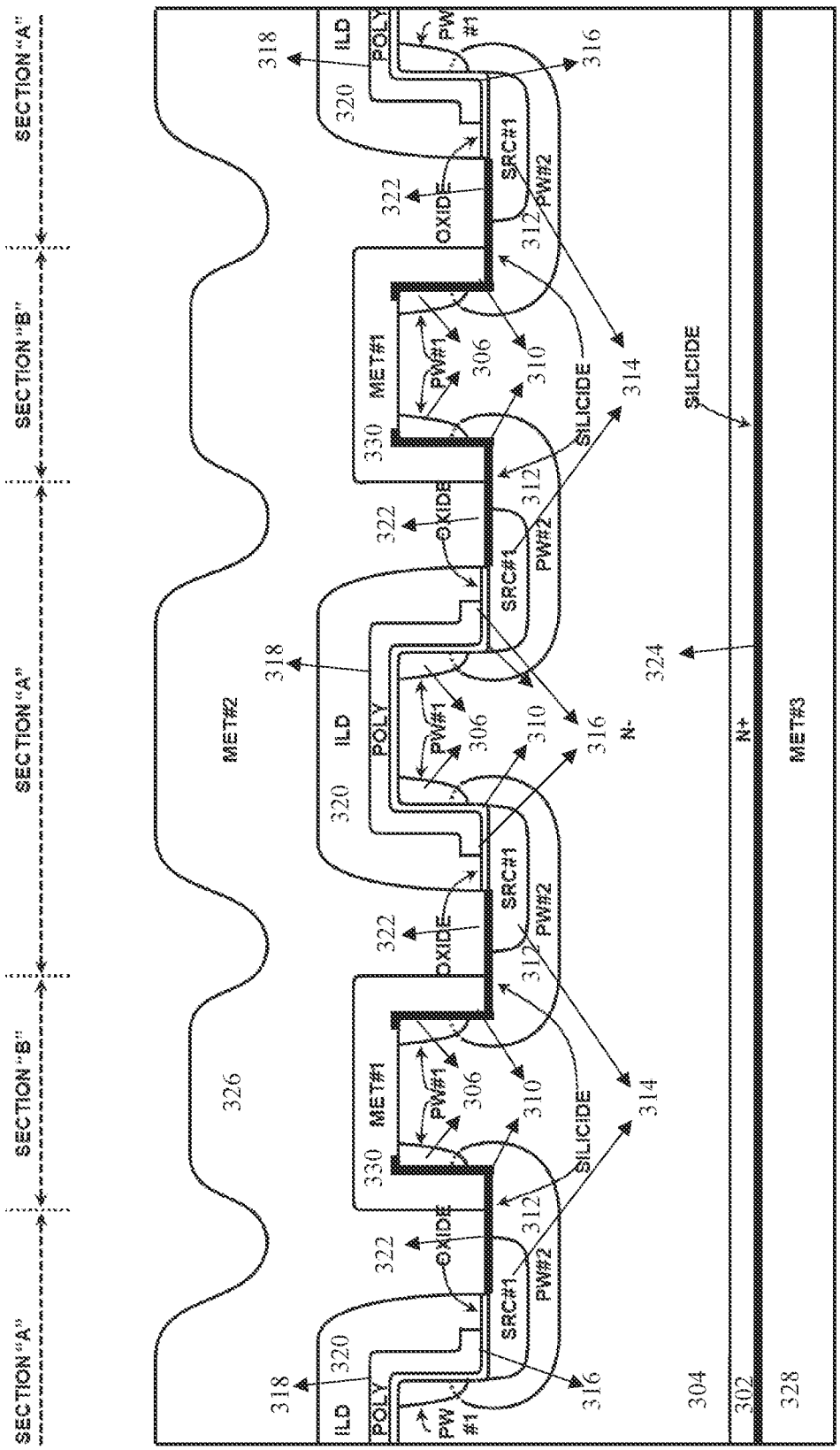
FIG. 3 illustrates an embodiment of a cross-sectional structure of one or more unit cells of a power MOSFET, a first unit cell of the one or more unit cells comprising a first metal oxide semiconductor (MOS) interface on a horizontal surface of a semiconductor substrate and a trench sidewall, and a second unit cell of the one or more unit cells comprising a metal region formed adjacent to a first conductivity type drift layer of the MOSFET.

FIG. 3 illustrates an embodiment of a cross-sectional structure of one or more unit cells of a power MOSFET, a first unit cell of the one or more unit cells comprising a first metal oxide semiconductor (MOS) interface on a horizontal surface of a semiconductor substrate and a trench sidewall, and a second unit cell of the one or more unit cells comprising a metal region 330 formed adjacent to a first conductivity type drift layer of the MOSFET. The MOSFET (shown in FIG. 3) is a n-type MOSFET. For the n-type MOSFET, the terms "first conductivity type" and "second conductivity type", are used to describe n-type and p-type respectively. In an embodiment, the MOSFET is a p-type MOSFET. For the p-type MOSFET, the terms "first conductivity type" and "second conductivity type", are used to describe p-type and n-type respectively.

The MOSFET (shown in FIG. 3) comprises the semiconductor substrate. The semiconductor substrate comprises a N+ substrate 302 (i.e. a first conductivity type substrate) and a N-drift layer 304 (i.e. a first conductivity type drift layer). In an embodiment, the semiconductor substrate comprises a silicon carbide (SiC) substrate. The MOSFET comprises a first section and a second section that are contiguously located along a lateral direction within the MOSFET. The first section comprises the first metal oxide semiconductor (MOS) interface, and the second section comprises the metal region 330. In an embodiment, the metal region comprises a junction barrier Schottky (JBS) diode region. The first section and the second section are arranged in at least one sequence from left to right or right to left.

In an embodiment, the at least one sequence comprises the first section at a first location and the second section at a second location along the lateral direction. In another embodiment, the at least one sequence comprises the second section at the first location and the first section at the second location along the lateral direction. In yet another embodiment, the at least one sequence comprises the first section at the first location and the second location along the lateral direction. In yet another embodiment, the at least one sequence comprises the second section at the first location and the second location along the lateral direction. In yet another embodiment, the at least one sequence comprises the first section at the first location and a third location, and the second section at the second location along the lateral direction. In yet another embodiment, the at least one sequence comprises the second section at the first location and the third location, and the first section at the second location along the lateral direction. For example, assume the first section as 'A' and the second section as 'B', then the at least one sequence comprises 'AB', 'BA', 'AA', 'BB', 'ABA', 'AAB', 'BAA', 'ABB', 'BAB', 'BBA', 'ABAB', 'ABBA', 'BAAB', etc.

The MOSFET comprises a first P-well region 306 (i.e. a second conductivity type first well region), a second P-well region 312 (i.e. a second conductivity type second well region), a source region 314, a metal region 330 and a trench region 310. The first P-well region 306 and the second P-well region 312 are two distinct well regions. The source region 314 is positioned (e.g. confined) within the second P-well region 312. The source region 314 and the second P-well region 312 are positioned closer to the first section and far away from the second section. The second P-well region 312 overlaps the first P-well region 306 at the first section and the second section. The trench region 310 is completely contained within the second P-well region 312. The trench region 310 is extended through the first P-well region 306. The first P-well region 306 and the second P-well region 312 completely enclose bottom portion (i.e. base) of the trench region 310 to shield the bottom portion from first high electric fields in off-state or during high-voltage blocking operation of the MOSFET. At the second section, the metal region (i.e. the junction barrier Schottky diode region) is shielded from second high electric fields present during high-voltage blocking condition. In an embodiment, spacing between the first P-well region 306 and the second P-well region 312 at the second section and the first section is adjusted suitably for maintaining a good trade-off between an on-state resistance, and a third electric field at the metal region and the first MOS interface. In another embodiment, a depth and a doping concentration of the first P-well region 306 and the second P-well region 312 are adjusted for maintaining the good trade-off between the on-state resistance, and the third electric field at the metal region and the first MOS interface. In yet another embodiment, a width and a depth of the trench region 310, and the implantation energy and the dosage of the first P-well region 306 and the second P-well region 312 are adjusted to control total extent and distribution of the first MOS interface.

The MOSFET further comprises silicide layers 322, 324 on top of the source region 314, and bottom of the N+ substrate (302). The silicide layer 322 on top of the source region 314 is partly positioned on top of the second P-well region 312 and the first P-well region 306. The first section comprises the first metal oxide semiconductor (MOS) interface. The first MOS interface comprises a first portion and a second portion. The first portion comprises a first contact with a horizontal surface (e.g. an unetched surface) of the semiconductor substrate. In an embodiment, the first portion of the first MOS interface is positioned parallel to 0001 crystal plane of the semiconductor substrate. In another embodiment, the first portion of the first MOS interface is positioned parallel to 11-20 crystal plane of the semiconductor substrate. The second portion of the first MOS interface comprises a second contact with a trench sidewall of the trench region 310. In an embodiment, the second portion of the first MOS interface is positioned parallel to one of 11-20 crystal plane and 1-100 crystal plane of the semiconductor substrate. The first section comprises a combination of a planar MOSFET structure and a trench MOSFET structure. The second section comprises the metal region 330 (e.g. the junction barrier Schottky diode region). The metal region 330 comprises a fourth contact with the N-drift layer 404 of the semiconductor substrate. The metal region 330 comprises a predefined work function. The metal region 330 comprises one of Ti, W, Mo, Au, Pt, TiW, TiN, etc.

The trench region 310 comprises the trench sidewall. In an embodiment, the trench sidewall of the trench region 310 comprises a sloped sidewall. The sloped sidewall comprises a sidewall angle ranging from 30° to 90°. In an embodiment, the trench region 310 comprises a depth ranging from 0.2 µm to 2.0 µm. A slope of the sloped sidewall is selected appropriately to orient the first MOS interface along a predefined crystal plane that comprises a low trap density. In an embodiment, the first portion of the first MOS interface is positioned parallel to 11-20 crystal plane and 0338 crystal plane of the sloped sidewall of the semiconductor substrate, when the trench sidewall comprises the sloped sidewall.

The MOSFET turns on when a drain terminal is biased positively as compared to a source terminal and the metal region turns on when the drain terminal is biased negatively with respect to the source terminal. The MOSFET shown in FIG. 3 depicts an equal number of unit cells of the metal regions and unit cells of the first MOS interfaces. In an embodiment, the MOSFET comprises an unequal number of the unit cells of the metal regions and the unit cells of the first MOS interfaces based on requirements. In another embodiment, a ratio of the number of the unit cells of the metal regions to the unit cells of first MOS interfaces is varied (e.g. increased, decreased) based on application.

Figure 4A:
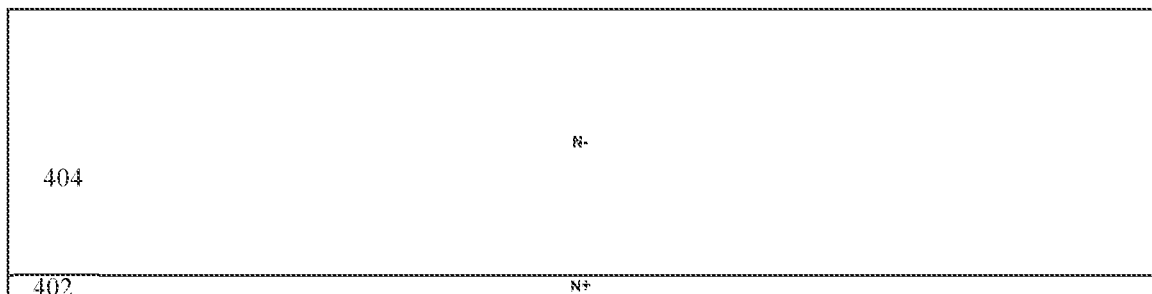
FIGS. 4a to 4aa are cross-sectional views illustrating an embodiment of a process of manufacturing the MOSFET structure shown in FIG. 3.
Figure 4B:
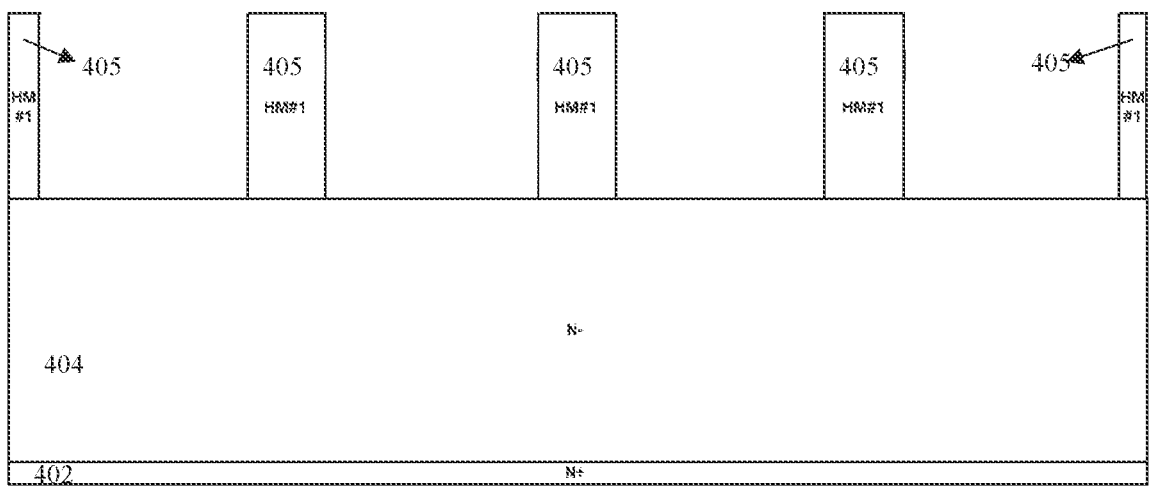
Figure 4C:
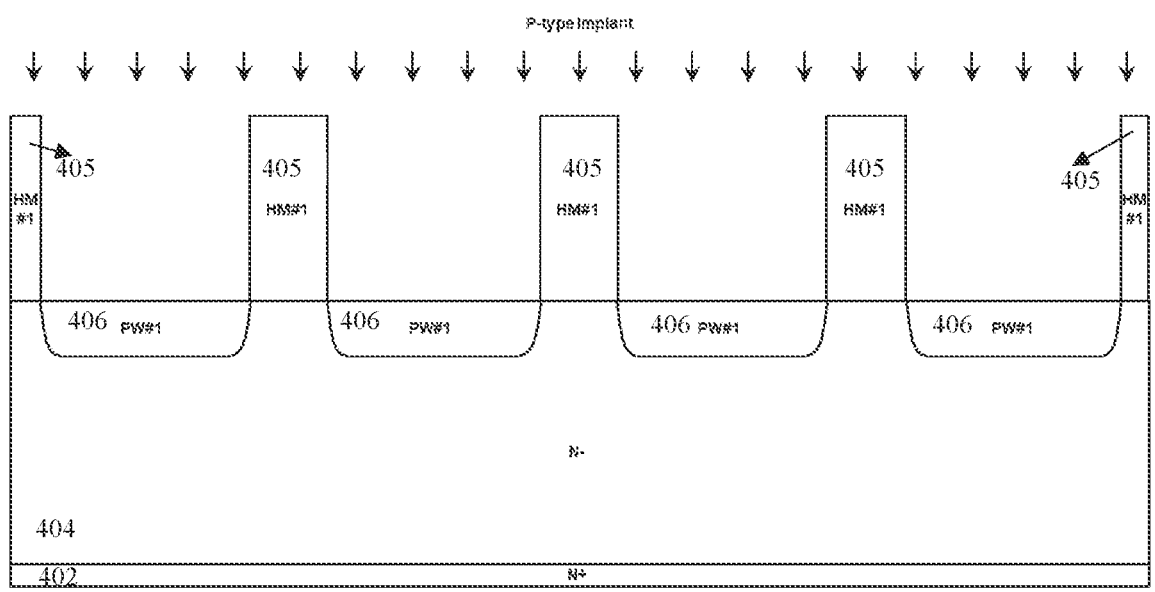
Figure 4D:
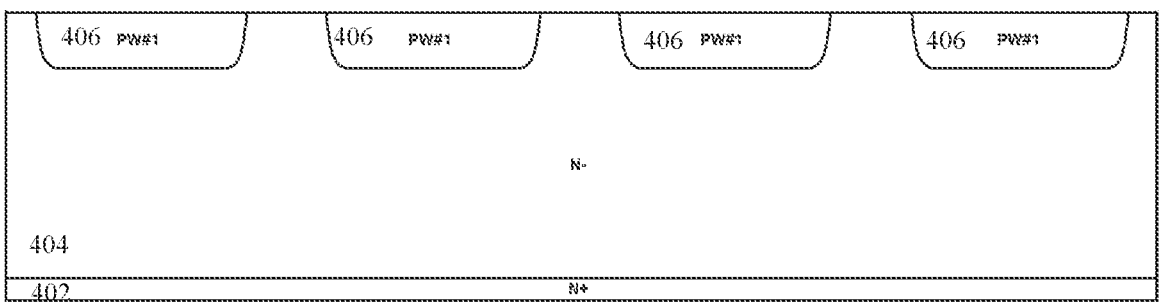

FIGS. 4 to 4aa are cross-sectional views illustrating an embodiment of a process of manufacturing the MOSFET structure shown in FIG. 3. The process of manufacturing the MOSFET structure shown in FIG. 3 comprises preparing a semiconductor substrate having a N+ substrate 402 and a N-drift layer 404 as shown in FIG. 4a. The N-drift layer 404 is grown on top of the N+ substrate 402. The N+ substrate 402 comprises a heavily doped substrate. A first patterned hard mask layer 405 is formed on topside of the semiconductor substrate as shown in FIG. 4b. A first p-type ion (e.g. Aluminum, Boron) implantation is formed on the topside of the semiconductor substrate through the first patterned hard mask layer 405 to form a first p-well region 406 as shown in FIG. 4c. The first patterned hard mask layer 405 is removed from the topside of the semiconductor substrate as shown in FIG. 4d. In an embodiment, the first p-well region 406 is formed by a first epitaxial growth using a p-type impurity (e.g. Aluminum, Boron) into the N-drift layer 404. The first P-well region 406 comprises a first predefined implantation energy and a first predefined dosage. In an embodiment, the first predefined implantation energy ranges from 5 keV to 5 MeV and the first predefined dosage ranges from 1E13 cm-2 to 5E16 cm-2. In another embodiment, the first P-well region 406 is formed using a first single ion-implantation step comprising combination of the predefined implantation energy and the predefined dosage. In yet another embodiment, the first P-well region 406 is formed using a first sequence of multiple ion-implantation steps. An ion-implantation step of the first sequence of multiple ion-implantation steps is performed with a different implantation energy or a different dosage. In an embodiment, the first P-type ion implantation (i.e. second conductivity type first ion implantation) is performed at one of room temperature and at elevated temperature up to 1000° C.

Figure 4E:
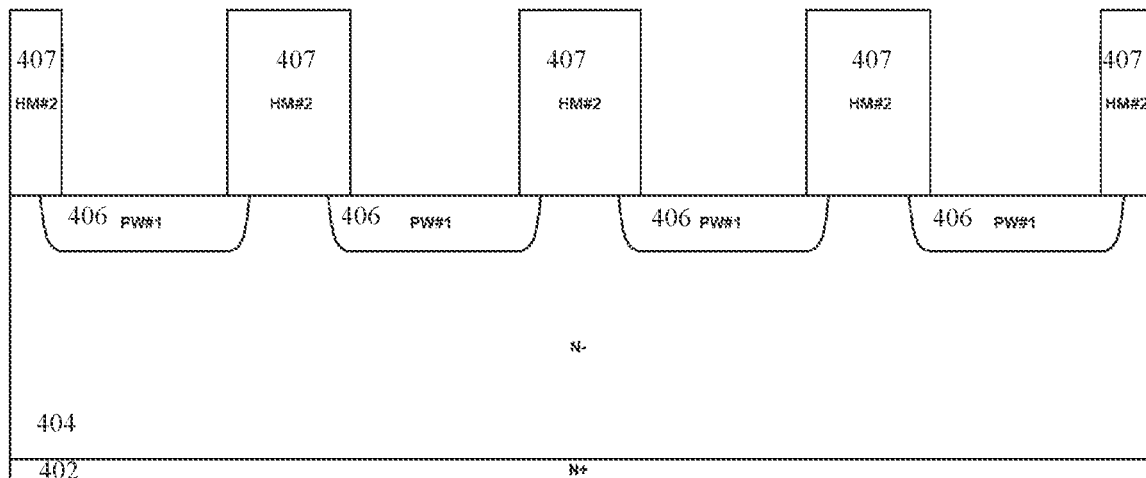
Figure 4F:
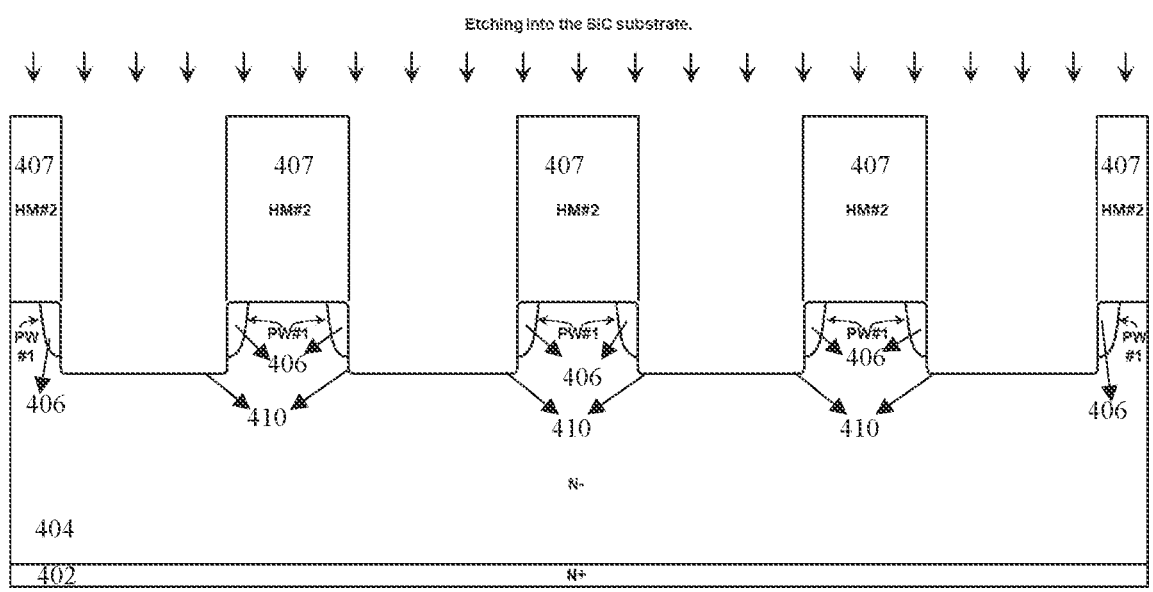
Figure 4G:
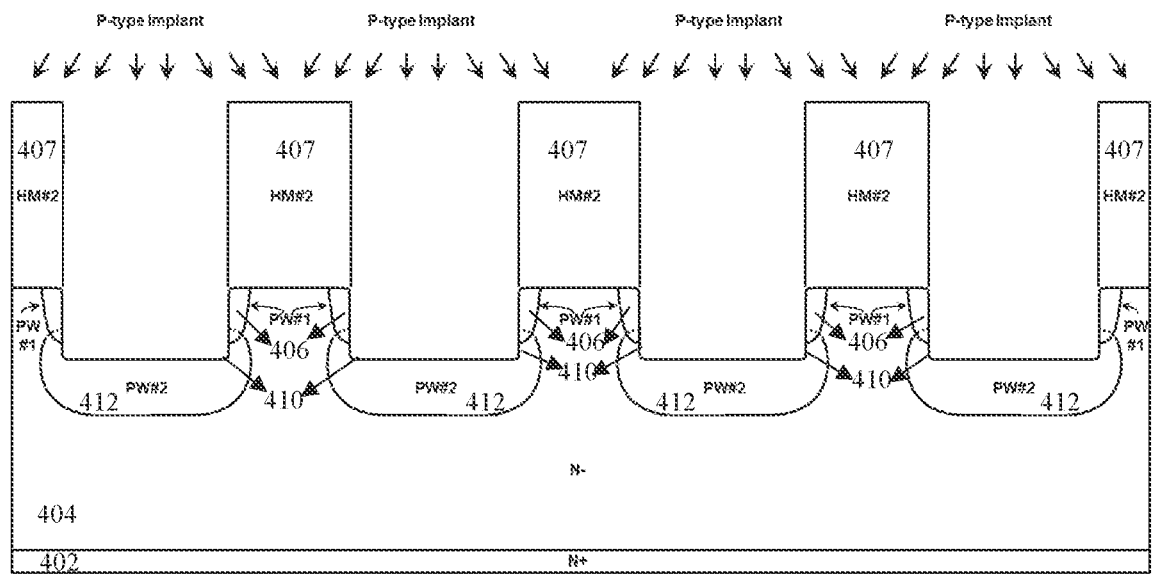

A second patterned hard mask layer 407 is formed on the topside of the semiconductor substrate as shown in FIG. 4e. A trench region 410 is formed by performing etching onto the topside (e.g. a top surface) of the semiconductor substrate through the second patterned hard mask layer 407 as shown in FIG. 4f In an embodiment the etching is performed using one of a reactive ion etching (RIE) and an inductively coupled plasma (ICP) etching. In another embodiment, the etching is controlled appropriately to form the trench region 410. The trench region 410 comprises a predefined depth and a predefined sidewall angle. The predefined depth of the trench region 410 ranges from 0.2 µm to 2.0 µm. The predefined sidewall angle ranges from 30° to 90°. The predefined depth of the trench region 410 is deeper than a depth of the first P-well region 406 (i.e. bottom portion of the trench region 410 may be in contact with the N-drift layer 404). The trench region 410 comprises a first section and a second section. In an embodiment, the trench region 410 is located within the MOSFET to delineate the first p-well region 406 to be in contact with the horizontal (or unetched) surface of the semiconductor substrate and the trench sidewall.

A second p-type ion implantation (e.g. Aluminum, Boron) is then performed to form a second P-well region 412 below the first P-well region 406 as shown in FIG. 2g. In an embodiment, the second p-type ion implantation (i.e. second conductivity type second ion implantation) comprises an angled implantation (i.e. at a predefined angle) to electrically short a portion of the second P-well region 412 and the first P-well region 406 at the first section and the second section (i.e. the second P-well region 412 overlaps the first P-well region 406 at the first section and the second section). In an embodiment, the angled implantation is performed using a tilt angle away from normal incidence. The tilt angle for the angled implantation may range from 0° (normal incidence) to 60°. The second P-well region 412 comprises a second predefined implantation energy and a second predefined dosage. In an embodiment, the second predefined implantation energy ranges from 5 keV to 5 MeV and the second predefined dosage ranges from 5E13 cm-2 to 5E16 cm-2. In another embodiment, the second P-well region 412 is formed using a second single ion-implantation step comprising combination of the predefined implantation energy and the predefined dosage. In yet another embodiment, the second P-well region 412 is formed using a second sequence of multiple ion-implantation steps. An ion-implantation step of the second sequence of multiple ion-implantation steps is performed with a different implantation energy or a different dosage. In an embodiment, the second P-type ion implantation is performed at one of the room temperature and the elevated temperature up to 1000° C. In an embodiment, the overlap between the first P-well region 406 and the second P-well region 412 are adjusted by varying at least one of the tilt angle and the second predefined implantation energy. The first P-well region 406 and the second P-well region 412 encloses the bottom portion of the trench region 410. The trench region 410 do not comprises a direct contact with the N-drift layer 404.

Figure 4H:
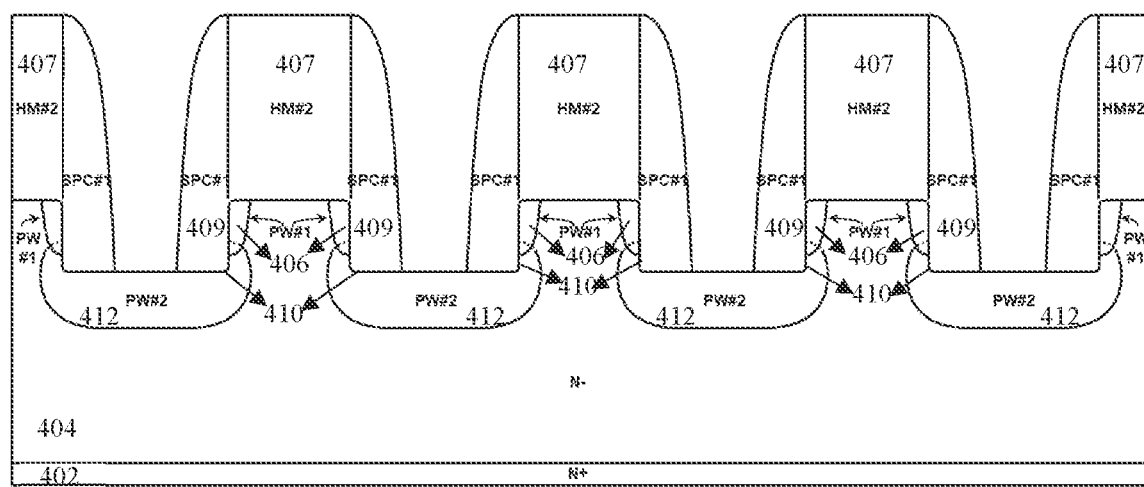
Figure 4I:
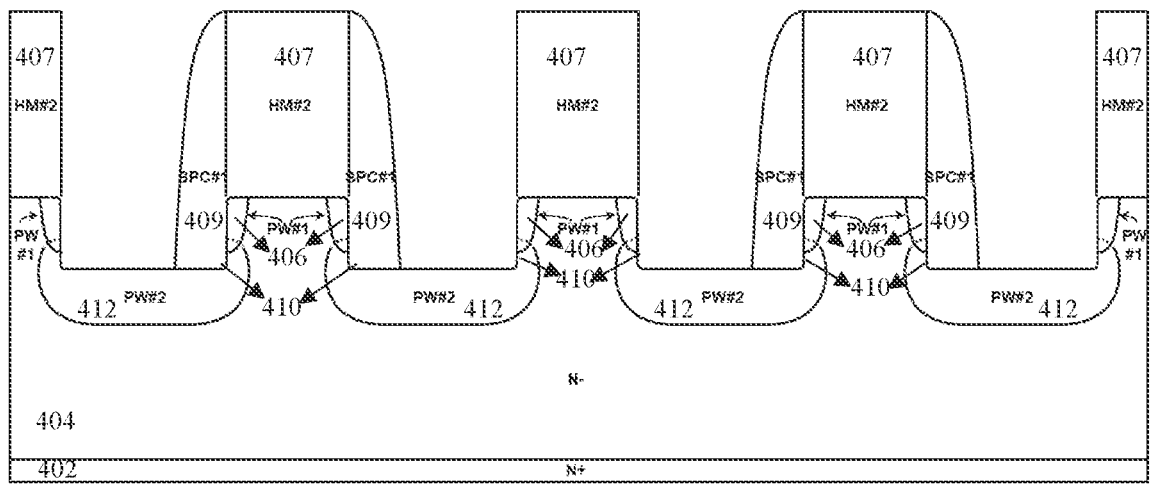

A first spacer 409 (i.e. sidewall spacer) is then formed on the semiconductor substrate along the trench sidewalls of the trench region 410 and the second patterned hard mask layer 407 as shown in FIG. 4h. In an embodiment, the first spacer 409 is formed using a dielectric material (e.g. silicon dioxide, silicon nitride). In an embodiment, the first spacer 409 and the hard mask layers (e.g. the first patterned hard mask layer 405, the second patterned hard mask layer 407) are formed using dis-similar dielectric materials to enable selective removal of one or more portions of the first spacer 409 without removal of the hard mask layers. The one or more portions of the first spacer 409, that are not in contact with the source region 414, are selectively removed as shown in FIG. 4i.

Figure 4J:
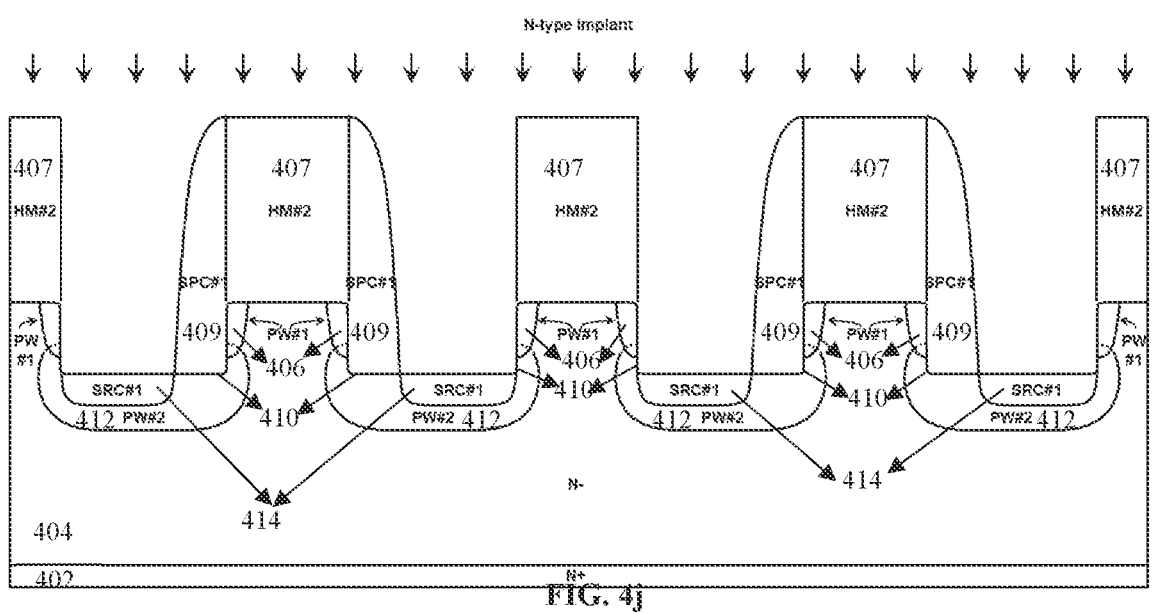

An n-type ion implantation (e.g. Nitrogen, Phosphorous) is then performed through the first spacer 409 to form the source region 414 within the second P-well region 412 as shown in FIG. 4j. The source region 414 and the second P-well region 412 are formed closer to the first section and far away from the second section. The source region 414 comprises a third predefined implantation energy and a third predefined dosage. In an embodiment, the third predefined implantation energy ranges from 5 keV to 1 MeV and the third predefined dosage ranges from 5E13 cm-2 to 5E16 cm-2. In another embodiment, the source region 414 is formed using a third single ion-implantation step comprising combination of the third predefined implantation energy and the third predefined dosage. In yet another embodiment, the source region 414 is formed using a third sequence of multiple ion-implantation steps. An ion-implantation step of the third sequence of multiple ion-implantation steps is performed with a different implantation energy or a different dosage. In an embodiment, the n-type ion implantation (i.e. first conductivity type ion implantation) is performed at one of the room temperature and the elevated temperature up to 1000° C.

Figure 4K:
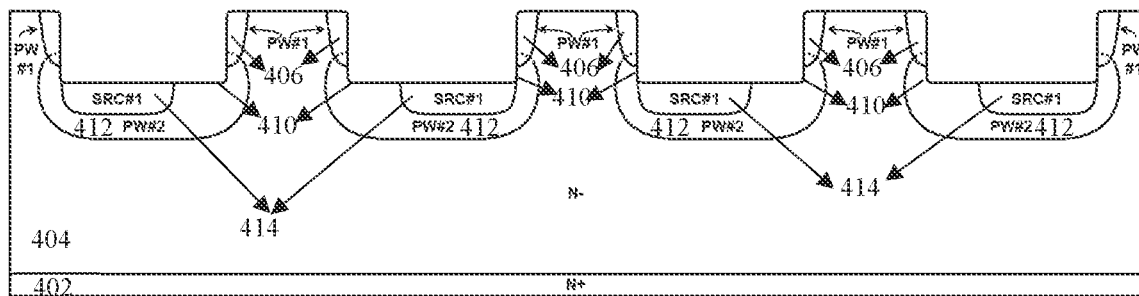
Figure 4L:
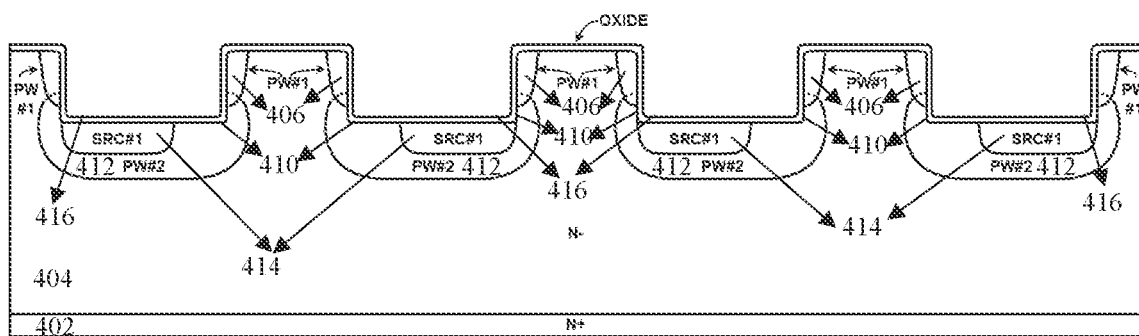
Figure 4M:
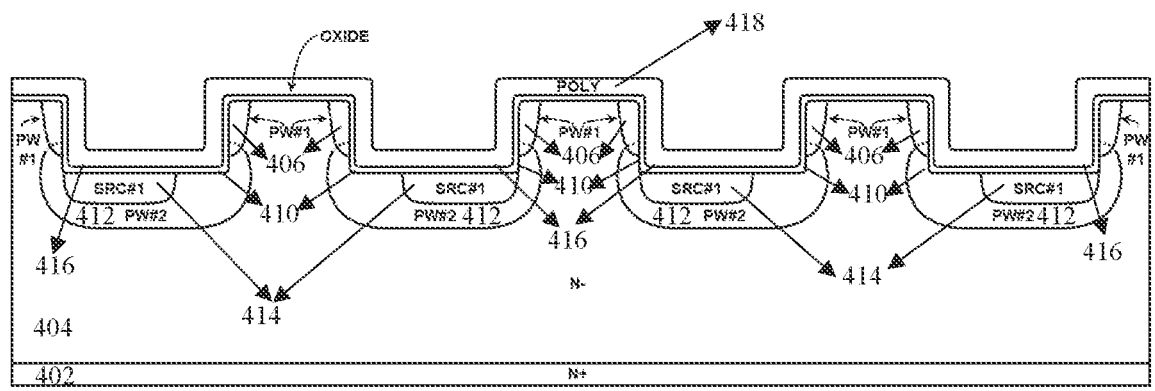
Figure 4N:
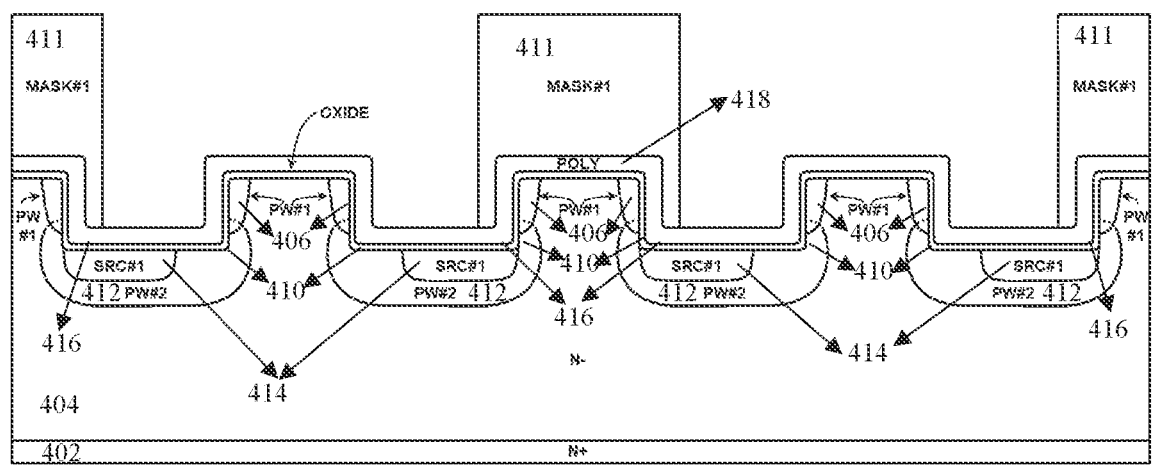
Figure 4O:
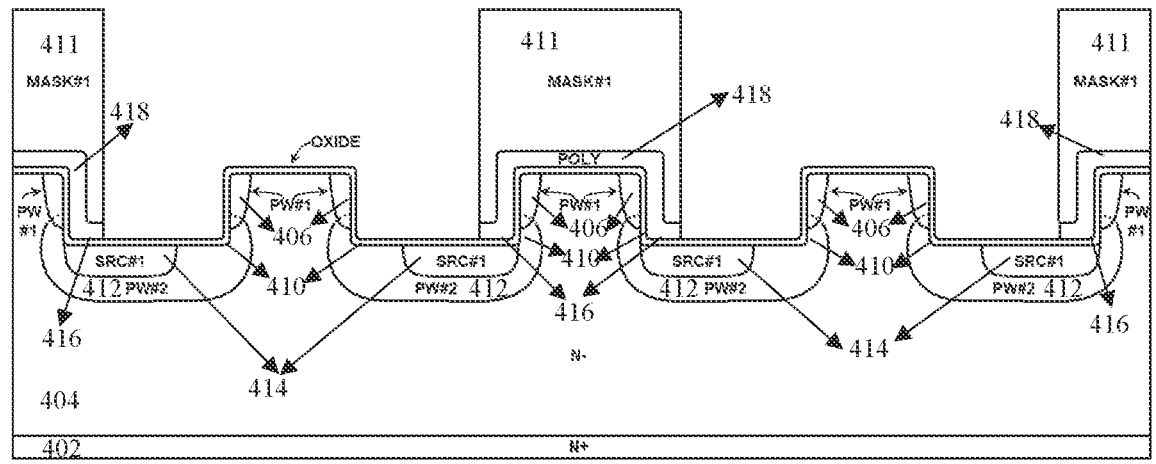
Figure 4P:
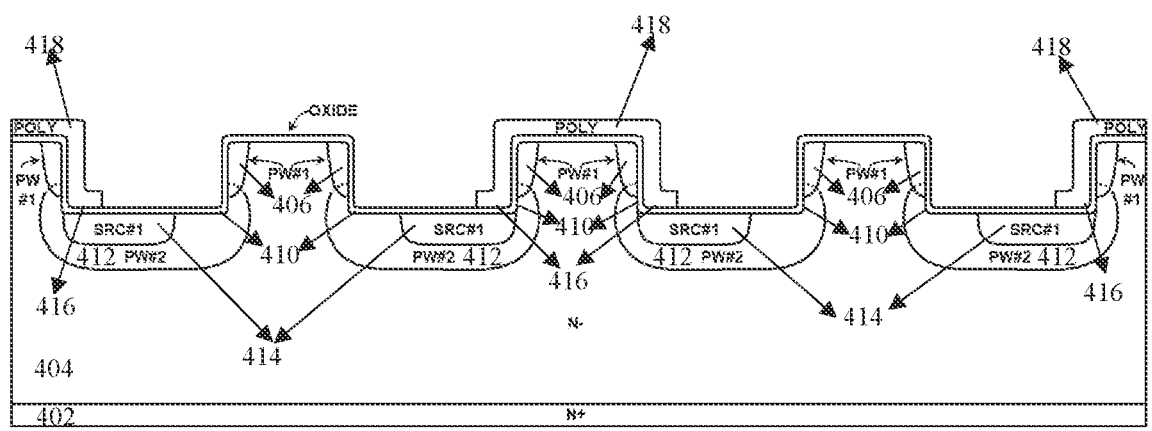
Figure 4Q:
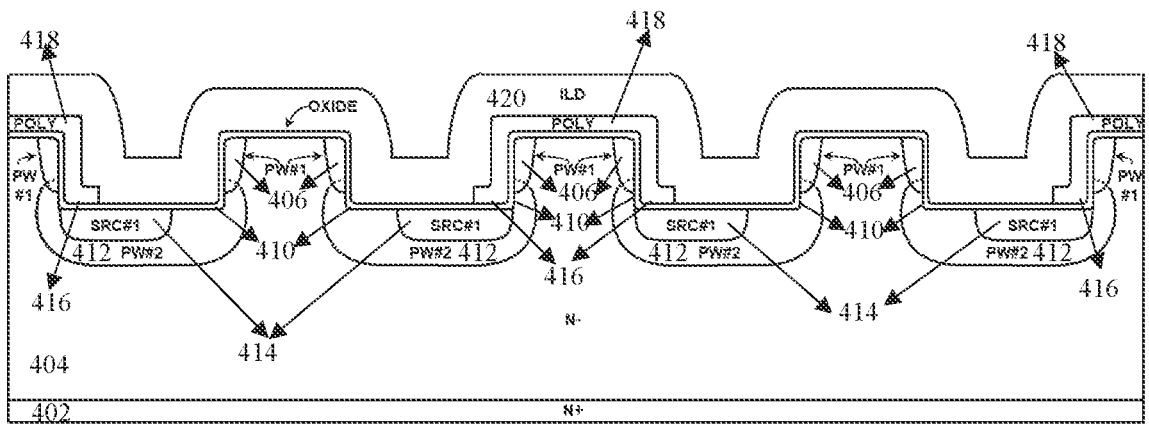
Figure 4R:
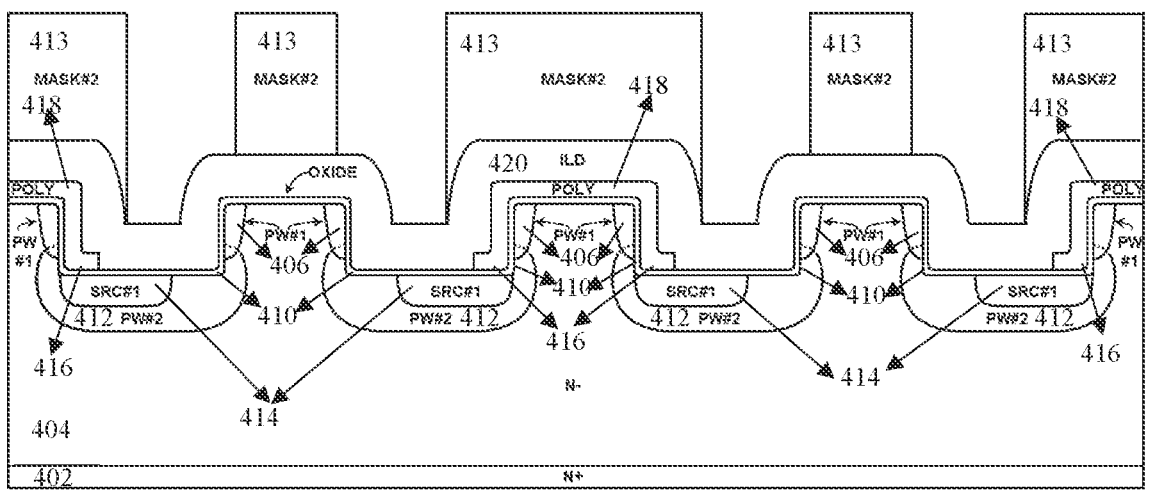
Figure 4S:
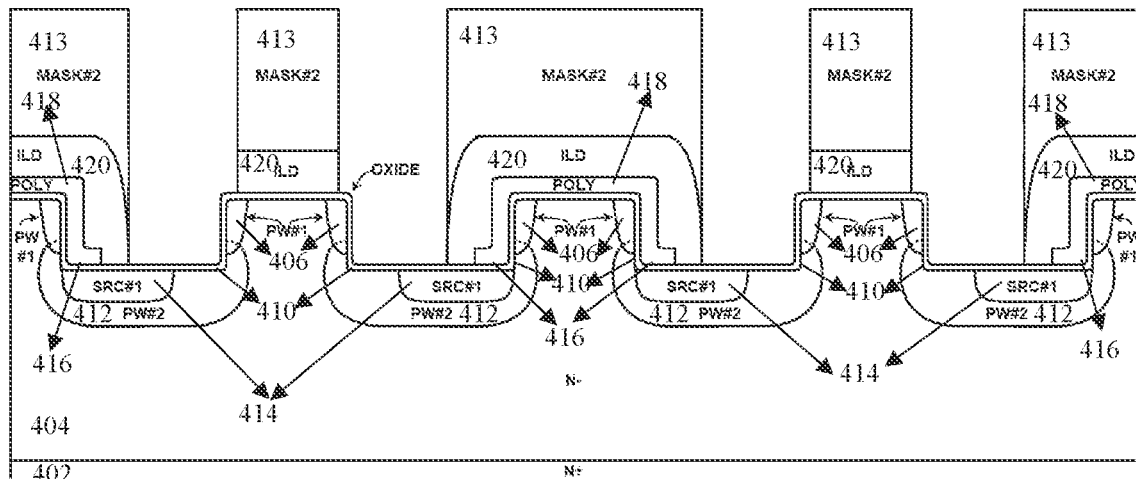
Figure 4T:
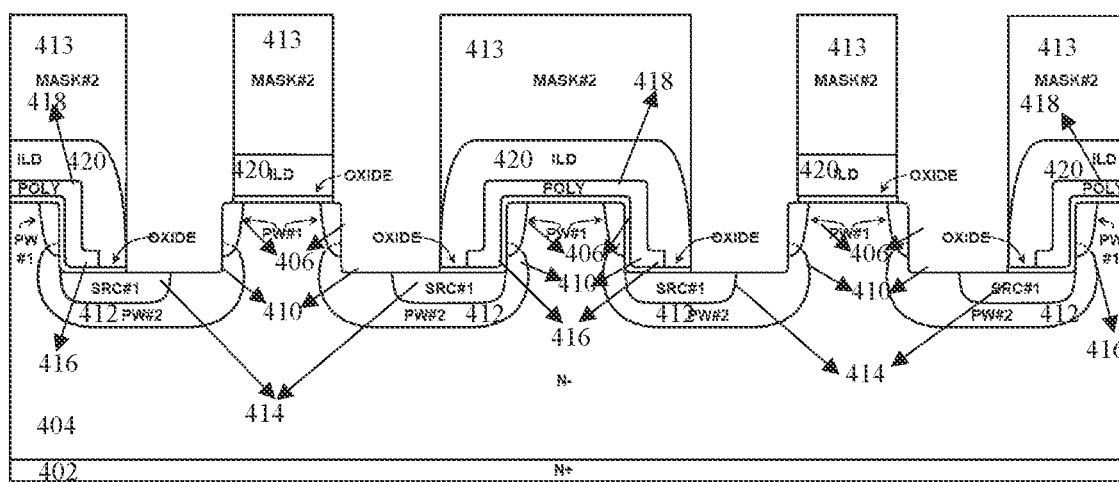
Figure 4U:
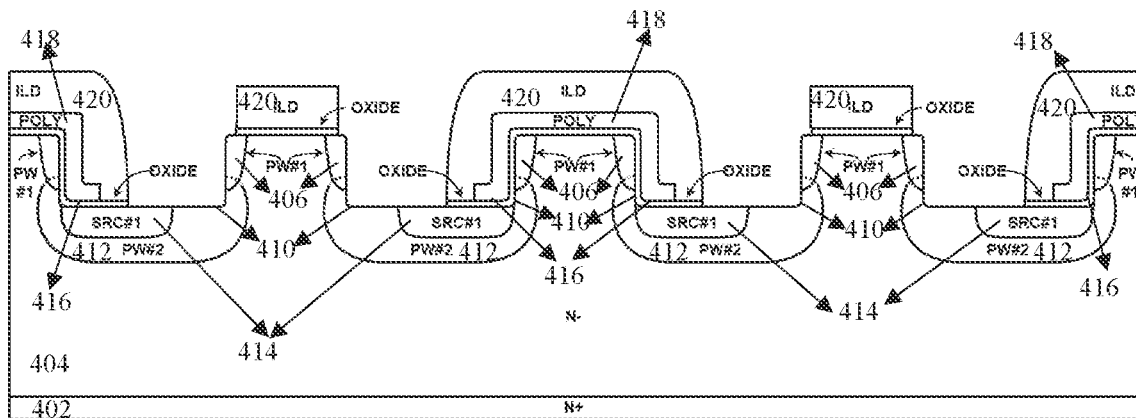
Figure 4V:
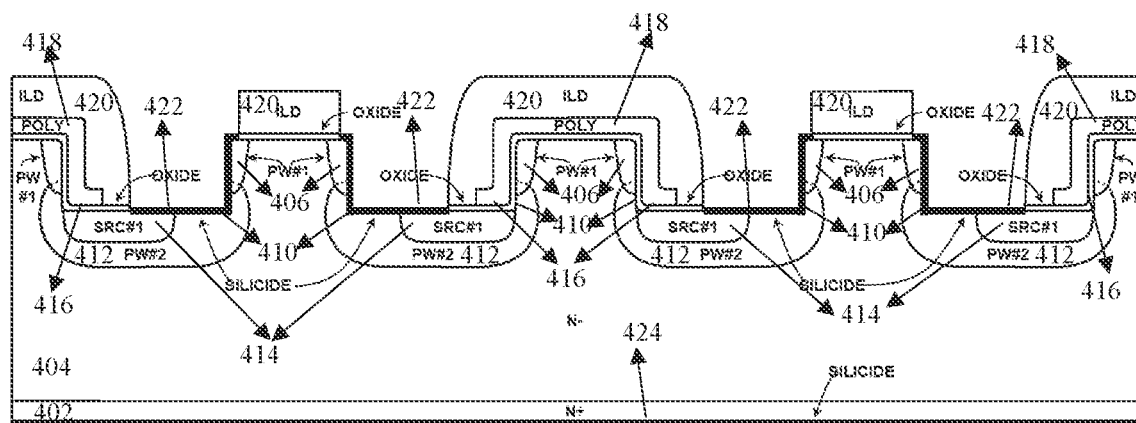
Figure 4W:
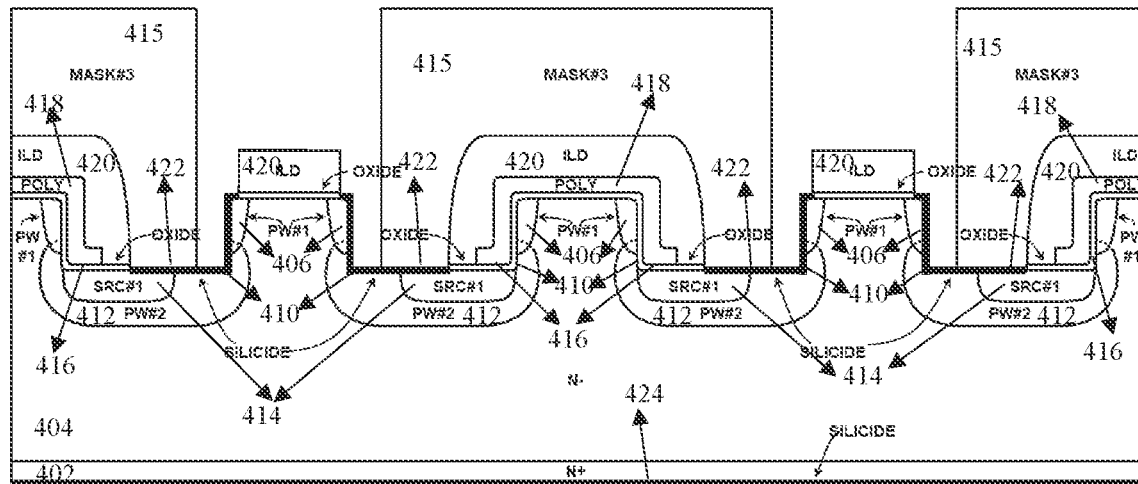
Figure 4X:
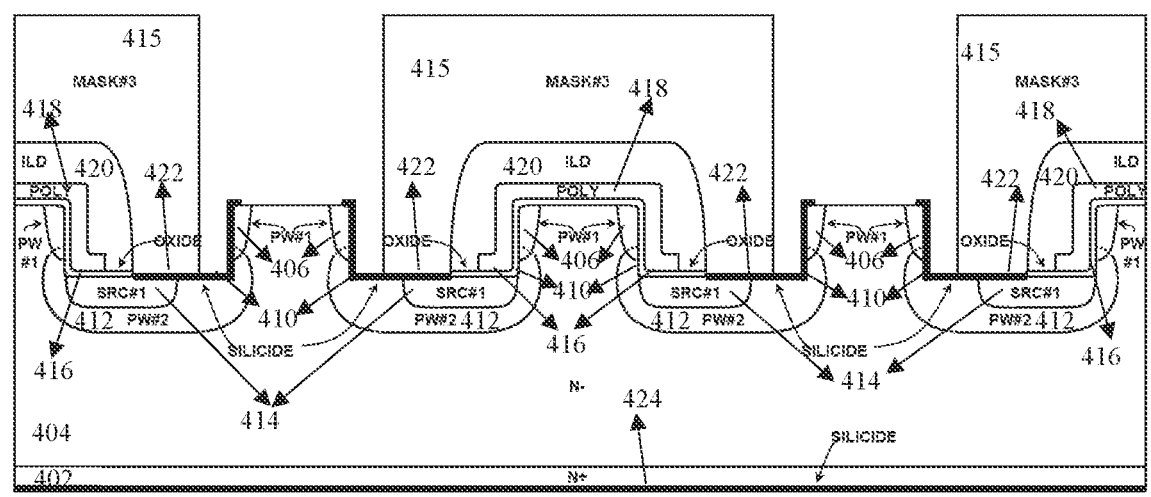
Figure 4Y:
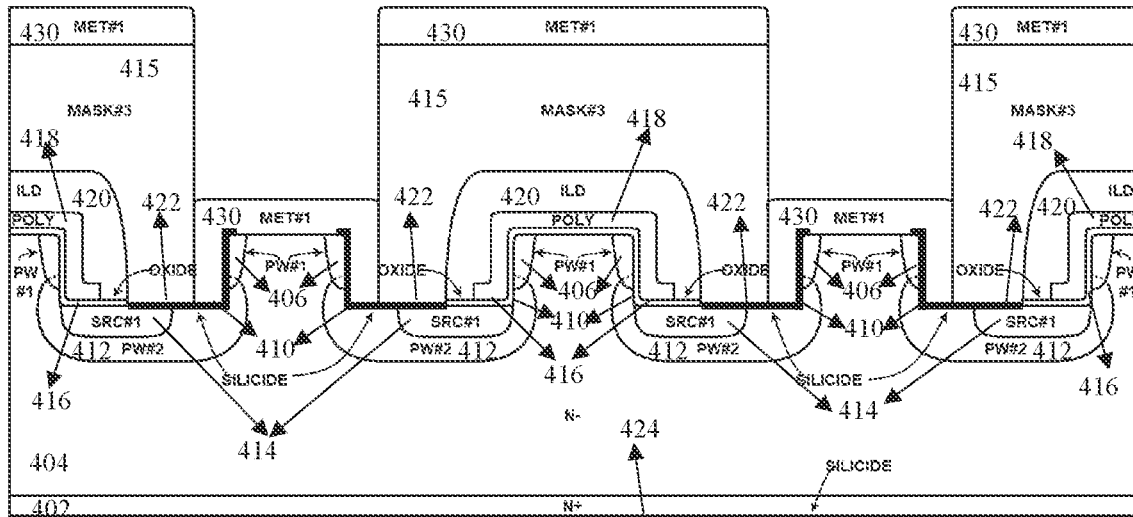
Figure 4Z:
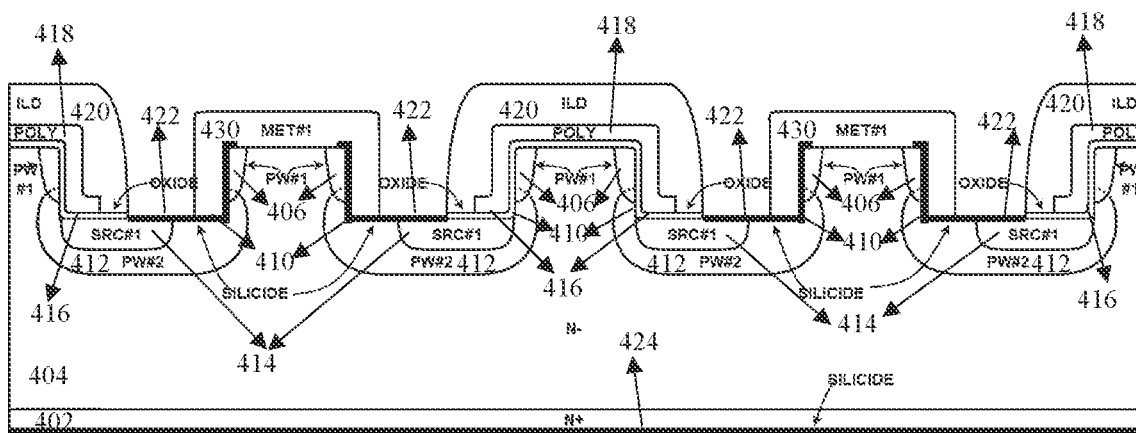
Figure 4A:
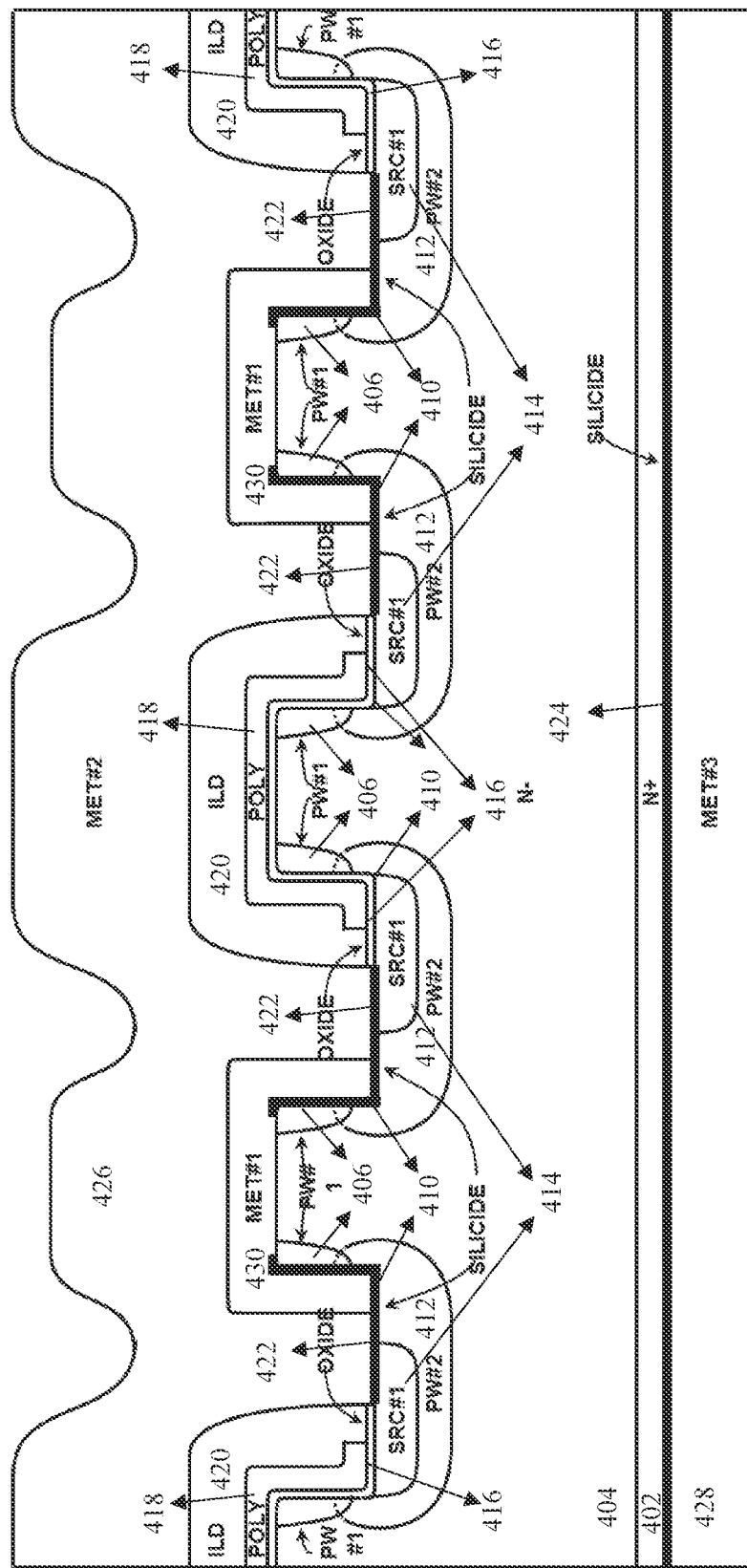
Figure 5A:
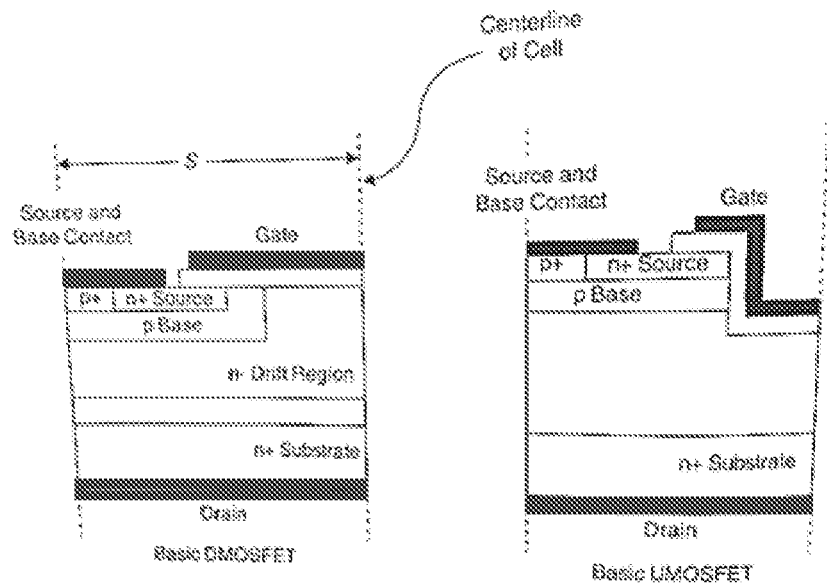
FIG. 5a shows two implementations of a power MOSFET in the form of a vertical, planar DMOSFET and a vertical trench UMOSFET.
Figure 5B:
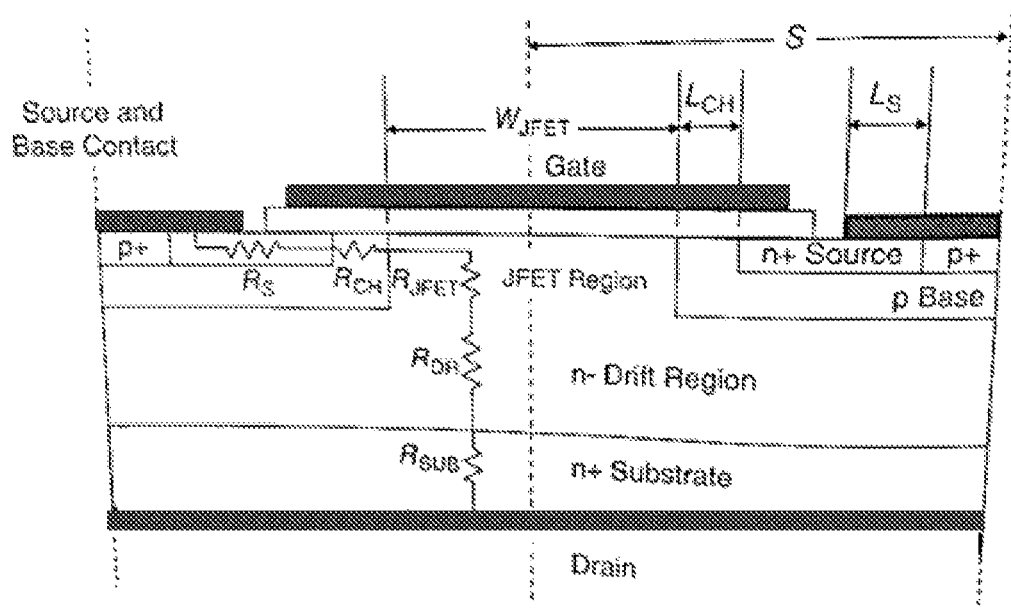
FIGS. 5b and 5c show major resistances in a vertical DMOSFET and a UMOSFET respectively and it is apparent that the geometry of the device effectively eliminates JFET resistance present in the DMOSFET.
Figure 5C:
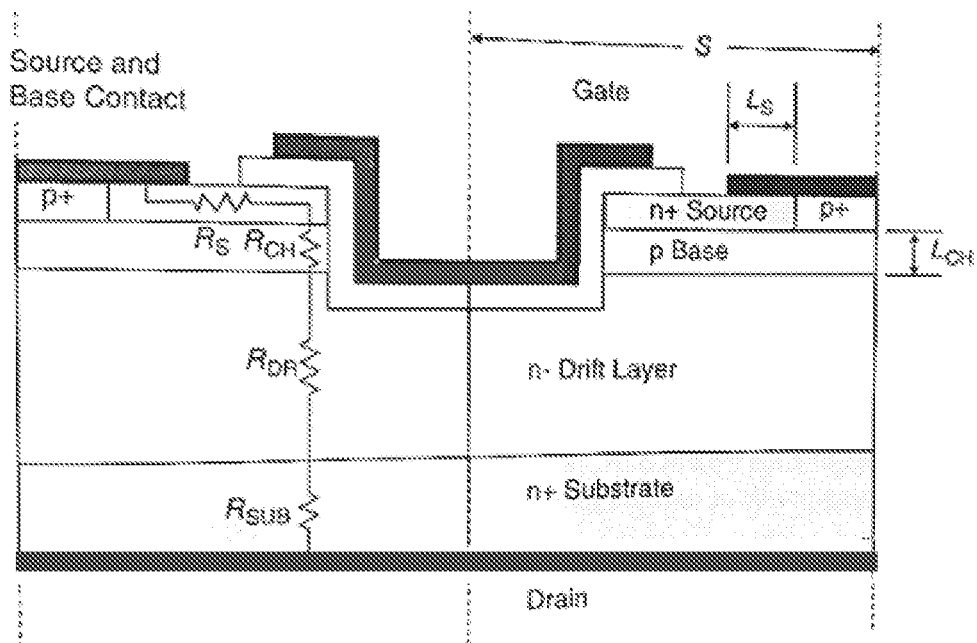
Figure 5D:
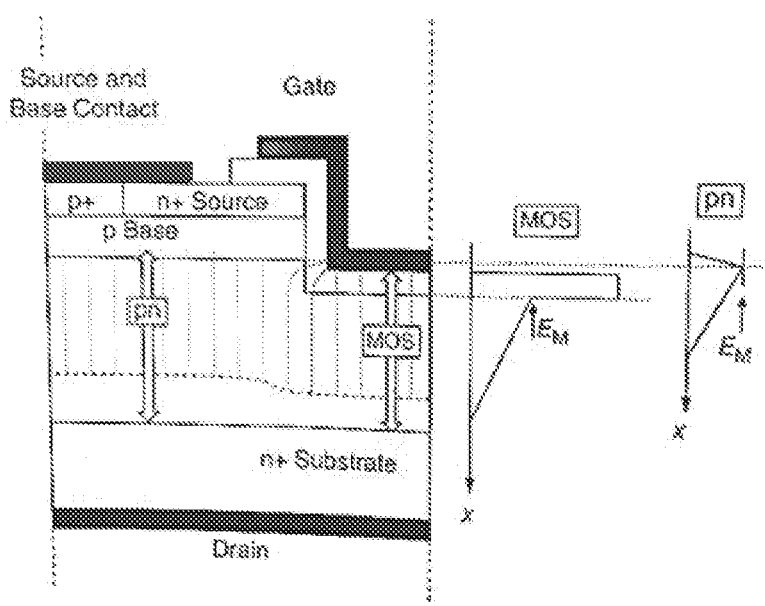
FIG. 5d illustrates electric fields in a UMOSFET in a blocking state, trench corners are significant locations of significant field crowding.

The hard mask layers (e.g. the first spacer 409, the second patterned hard mask layer 407) are removed as shown in FIG. 4k. The semiconductor substrate (e.g. wafers) is then subjected to high-temperature heat treatment for activating implanted ions and for implant damage alleviation. In an embodiment, the heat treatment or annealing is performed at a temperature ranging from 1700° C.-2000° C., for a duration ranging from 10 min to 2 hours. A gate dielectric layer 416 is formed onto the topside of exposed portions of the semiconductor substrate as shown in FIG. 4l. In an embodiment, the gate dielectric layer 416 is an oxide layer. In another embodiment, the gate dielectric layer 416 is formed by one of a thermal oxidation and a chemical vapor deposition (CVD) of a dielectric layer (e.g. silicon dioxide, silicon nitride, silicon oxynitride, etc.). Then a poly silicon layer 418 is formed onto the topside of the semiconductor substrate as shown in FIG. 4m. In an embodiment, the poly silicon layer 418 comprises a n-type doped layer. The n-type doped layer is using a n-type dopant (e.g. phosphorous). A third patterned masking layer 411 is formed on top of the poly silicon layer 418 as shown in FIG. 4n. The poly silicon layer 418 is then selectively etched using the third patterned masking layer 411 to form one or more poly silicon regions as shown in FIG. 4o. The third patterned masking layer 411 is removed as shown in FIG. 4p. Then an interlayer dielectric (ILD) 420 is formed onto the topside of the semiconductor substrate as shown in FIG. 4q. A fourth patterned masking layer 413 is formed on top of the interlayer dielectric (ILD) 420 as shown in FIG. 4r. The interlayer dielectric (ILD) 420 is then selectively etched using the fourth patterned masking layer 413 as shown in FIG. 4s. The gate dielectric layer 416 is also selectively etched using the fourth patterned masking layer 413 as shown in FIG. 4t. The fourth patterned masking layer 413 is then removed from the semiconductor substrate and the semiconductor substrate is exposed to air as shown in FIG. 4u. Silicide layers 422, 424 are then formed on the topside and bottom side of the semiconductor substrate to form a source terminal and a drain terminal respectively as shown in FIG. 4v. The silicide layer 422 on the topside of the semiconductor substrate is formed partly on the first P-well region 406, the second P-well region 412 and the source region 414. A fifth patterned masking layer 415 is formed on the topside of the semiconductor substrate as shown in FIG. 4w. Then the interlayer dielectric (ILD) 420 is selectively etched through the fifth patterned masking layer 415 as shown in FIG. 4x. Then a metal region 430 is deposited and patterned on the topside of the semiconductor substrate through the fifth patterned masking layer 415 as shown in FIG. 4y. In an embodiment, the metal region 430 comprises a junction Schottky barrier diode region. The metal region comprises a predefined work function. The metal region comprises one of Ti, W, Mo, Au, Pt, TiW, TiN, etc. The fifth patterned masking layer 415 is then removed to lift off the metal region 430 on top of the fifth patterned masking layer as shown in FIG. 4z. A first inter-connect metal layer 426 and a second inter-connect metal layer 428 is then formed on the topside and the bottom side of the semiconductor substrate respectively as shown in FIG. 4aa.

The present disclosure may be embodied in other specific forms without departing from its spirit or characteristics. The described embodiments are to be considered in all respects only as illustrative and not restrictive. The scope is, therefore, indicated by the appended claims rather than by the foregoing description. All changes which come within the meaning and range of equivalency of the claims are to be embraced within their scope.

Other embodiments are also within the scope of the following claims.

Although, various embodiments which incorporate the teachings described in detail herein, those skilled in the art can readily devise many other varied embodiments that still incorporate these teachings. For example, a complementary MOSFET device with a P+ substrate, P− drift layer and P+ source can be created in a N-well region. The embodiments described are all applicable to the complementary MOSFET as well.

All documents (patents, patent publications or other publications) mentioned in the specification are incorporated herein in their entirety by reference.

INCORPORATION BY REFERENCE

All publications, patents, and patent applications cited in this Specification are hereby incorporated by reference in their entirety.
T. Kimoto, J. A. Cooper in Fundamentals of Silicon Carbide Technology, IEEE Press (2014) U.S. patent application Ser. No. 16/374,025, filed Apr. 3, 2019, entitled "DESIGN AND MANUFACTURE OF POWER DEVICES HAVING INVERSION CHANNEL" U.S. patent application Ser. No. 16/945,781, filed Jul. 31, 2020, entitled "DESIGN AND MANUFACTURE OF POWER DEVICES HAVING INCREASED CROSS OVER CURRENT"

What is claimed is:

1. A method comprising:
   forming a unit cell of a silicon carbide device by
   forming a drift region of a first conductivity type;
   forming a first well region of a second conductivity type by a first ion-implantation;
   depositing and patterning a first hard mask layer followed by etching through the first well region using the patterned first hard mask layer to form a trench region; and
   forming a second well region of the second conductivity type by a second ion-implantation;
   depositing and patterning a second hard mask layer; and
   forming a first source region of the first conductivity type by a third ion-implantation through the second hard mask layer, wherein the first source region is located, away from a bottom of the trench region, at a second section of the unit cell;
   wherein the second well region overlaps a portion of the first well region to form a composite well region at a first section.

2. The method of claim 1, wherein the first hard mask layer and the second hard mask layer are formed using dissimilar materials.

3. The method of claim 1, wherein the first hard mask layer and the second hard mask layer are formed using one of a silicon dioxide layer and a silicon nitride layer.

4. The method of claim 1, wherein the first hard mask layer and the second hard mask layer are formed using a stacked combination of dissimilar materials.

5. The method of claim 1, further comprises: forming a metal layer in contact with the drift region at the first section of the unit cell.

6. A method comprising:
   forming a unit cell of a silicon carbide device by
   forming a drift region of a first conductivity type;
   forming a first well region of a second conductivity type by a first ion-implantation;
   depositing and patterning a first hard mask layer followed by etching through the first well region using the patterned first hard mask layer to form a trench region;
   forming a first spacer, through the first hard mask layer, along trench sidewalls of the trench region and the first hard mask layer; and
   forming a second well region of the second conductivity type by a second ion-implantation through the first spacer located at a second section;
   wherein the second well region overlaps a portion of the first well region to form a composite well region at a first section,
   wherein the second well region is formed by the second ion-implantation using a tilt angle between 0 degrees and 60 degrees from a normal incidence angle.

7. The method of claim 6, further comprises: selectively removing the first spacer at the first section of the unit cell.

8. The method of claim 6, wherein forming the second well region of the second conductivity type comprises:
   forming the second well region of the second conductivity type by an angled implantation using a tilt angle away from normal incidence through the first spacer located at the second section.

9. The method of claim 8, wherein forming the second well region of the second conductivity type by the angled implantation using the tilt angle away from normal incidence comprises: forming the second well region overlapping the portion of the first well region to form the composite well region at the first section of the unit cell.

10. The method of claim 6, wherein forming the second well region of the second conductivity type by the second ion-implantation through the first spacer located at the second section comprises: forming the second well region with the drift region between the second well region and the first well region at the second section.

11. The method of claim 6, wherein the trench region comprises a first depth greater than a second depth of the first well region.

12. The method of claim 6, further comprises: forming a second spacer, over the first spacer, along trench sidewalls of the trench region and the first hard mask layer.

13. The method of claim 12, further comprises: selectively removing the second spacer at the first section of the unit cell.

14. The method of claim 13, further comprises: forming a second source region of the first conductivity type by performing a fourth ion-implantation through the second spacer located at a second section of the unit cell.

15. The method of claim 14, further comprises: forming the second source region confined within the second well region.

16. The method of claim 14, wherein forming the second source region of the first conductivity type through the second spacer located at the second section comprises: forming the second source region closer to the first section of the unit cell.

17. The method of claim 6, wherein forming the second well region of the second conductivity type through the first spacer located at the second section comprises: forming the second well region closer to the first section of the unit cell.

* * * * *